United States Patent
Bourenane et al.

(10) Patent No.: US 12,407,365 B2
(45) Date of Patent: Sep. 2, 2025

(54) DECODING OF SERIES-CONCATENATED TURBO CODES

(71) Applicant: SAFRAN DATA SYSTEMS, Courtaboeuf (FR)

(72) Inventors: Aomar Bourenane, Moissy-Cramayel (FR); Frédéric Guilloud, Palaiseau (FR); Matthieu Arzel, Palaiseau (FR)

(73) Assignee: SAFRAN DATA SYSTEMS, Courtaboeuf (FR)

( * ) Notice: Subject to any disclaimer, the term of this patent is extended or adjusted under 35 U.S.C. 154(b) by 0 days.

(21) Appl. No.: 18/289,644

(22) PCT Filed: May 7, 2021

(86) PCT No.: PCT/FR2021/050788
§ 371 (c)(1),
(2) Date: Nov. 6, 2023

(87) PCT Pub. No.: WO2022/234196
PCT Pub. Date: Nov. 10, 2022

(65) Prior Publication Data
US 2024/0243756 A1    Jul. 18, 2024

(51) Int. Cl.
*H03M 13/11*   (2006.01)
*H03M 13/00*   (2006.01)
*H03M 13/29*   (2006.01)

(52) U.S. Cl.
CPC ... *H03M 13/1105* (2013.01); *H03M 13/2972* (2013.01); *H03M 13/6561* (2013.01)

(58) Field of Classification Search
CPC ......... H03M 13/1105; H03M 13/2981; H03M 13/395; H03M 13/6561; H03M 13/2972
See application file for complete search history.

(56) References Cited

U.S. PATENT DOCUMENTS 7,116,710 B1    10/2006  Jin et al.
2018/0212627 A1*  7/2018  Hosseini ........... H03M 13/2942

OTHER PUBLICATIONS

Y.-C. Lu and E.- H. Lu, "A Parallel Decoder Design for Low Latency Turbo Decoding," Second International Conference on Innovative Computing, Informatio and Control (ICICIC 2007), Kumamoto, Japan, 2007, pp. 386-386, (Year: 2007).*

(Continued)

*Primary Examiner* — Cynthia Britt
(74) *Attorney, Agent, or Firm* — BIRCH, STEWART, KOLASCH & BIRCH, LLP

(57) ABSTRACT

Series turbo-decoder, series turbo-decoding method and computer program product, the series turbo-decoder comprises an input configured to receive a word to be decoded comprising informative data or payload data, internal and external redundancy data, an internal decoder (DCI) and an external decoder (DCE). The internal decoder and the external decoder receive the word simultaneously. The internal decoder is configured to perform part of the decoding of the word based on the payload data and on the internal and external redundancy data. The external decoder is configured to perform another part of the decoding of the word based on the payload data and on the external redundancy data without awaiting the availability of information extrinsic to the internal decoder.

13 Claims, 14 Drawing Sheets

(56) References Cited

OTHER PUBLICATIONS

Ambroze et al., "Iterative MAP decoding for serial concatenated convolutional codes," IEEE Proc.-Commun., vol. 145, No. 2, Apr. 1998, pp. 53-59.

Argon et al., "A Parallel Decoder for Low Latency Decoding of Turbo Product Codes," IEEE Communications Letters, vol. 6, No. 2, Feb. 2002, pp. 70-72.

Bahl et al., "Optimal Decoding of Linear Codes for Minimizing Symbol Error Rate," IEEE Transactions on Information Theory, Mar. 1974, pp. 284-287.

Benedetto et al., "Serial concatenation of block and convolutional codes," Electronics Letters, vol. 32, No. 10, May 9, 1996, pp. 887-888.

Boutillon et al., "Iterative Decoding of Concatenated Convolutional Codes: Implementation Issues," Proceedings of the IEEE, vol. 95, No. 6, Jun. 2007, pp. 1201-1227 (28 pages total).

Divsalar et al., "Multiple Turbo Codes for Deep-Space Communications," TDA Progress Report 42-121, May 15, 1995, pp. 66-77.

Lu et al., "A Parallel Decoder Design for Low Latency Turbo Decoding," IEEE, 2007, pp. 1-4.

Martina et al., "High Throughput implementation of an adaptive serial concatenation turbo decoder," Journal of Communications Software and Systems, vol. 2, No. 3, Sep. 2006, pp. 252-261.

Muller et al., "Exploring Parallel Processing Levels for Convolutional Turbo Decoding," IEEE, vol. 2, 2006, pp. 2353-2358.

Schurgers et al., "Memory Optimization of MAP Turbo Decoder Algorithms," IEEE Transactions on Very Large Scale Integration (VLSI) Systems, vol. 9, No. 2, Apr. 2001, pp. 305-312.

Shoup, "Hardware Implementation of a High-Throughput 64-PPM Serial Concatenated Turbo Decoder," Proc. of SPIE, vol. 6311, 2006, pp. 63110S-1-63110S-8.

Studer et al., "Implementation Trade-offs of Soft-Input Soft-Output MAP Decoders for Convolutional Codes," IEEE Transactions on Circuits and Systems I, vol. 59, No. 1, Nov. 2012, pp. 1-10.

Zhang et al., "High-Throughput Radix-4 logMAP Turbo Decoder Architecture," IEEE, 2006, pp. 1711-1715.

Zhang et al., "Shuffled Iterative Decoding," IEEE Transactions on Communications, vol. 53, No. 2, Feb. 2005, pp. 209-213.

\* cited by examiner

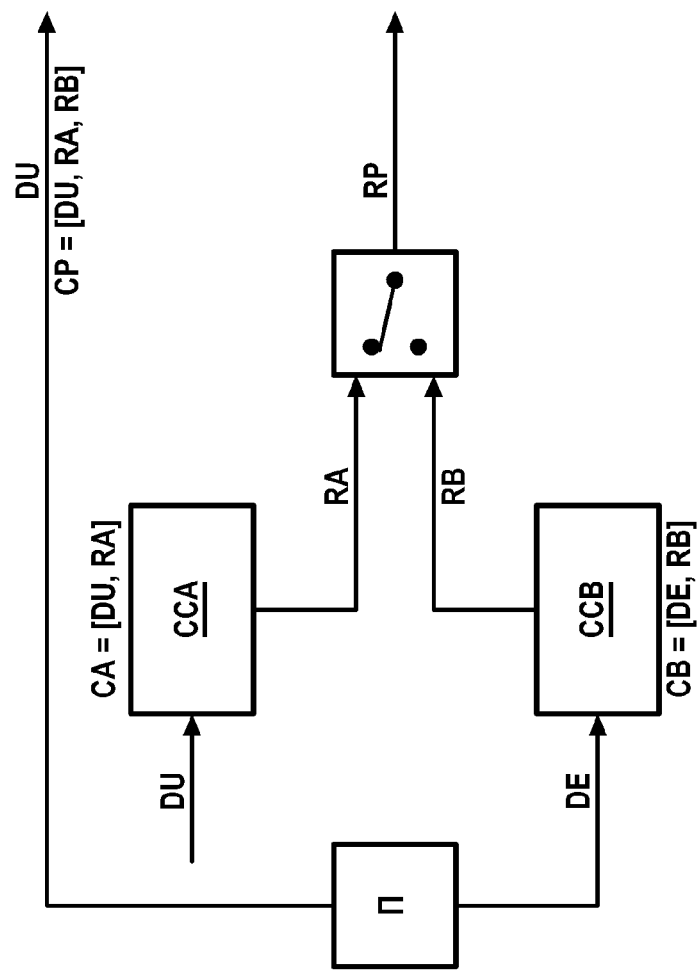

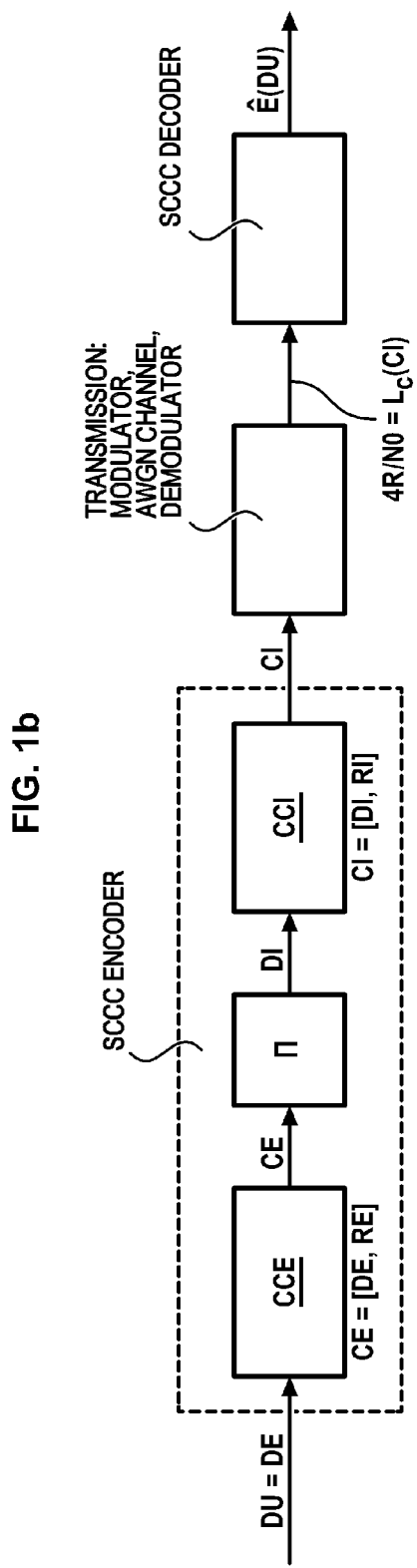

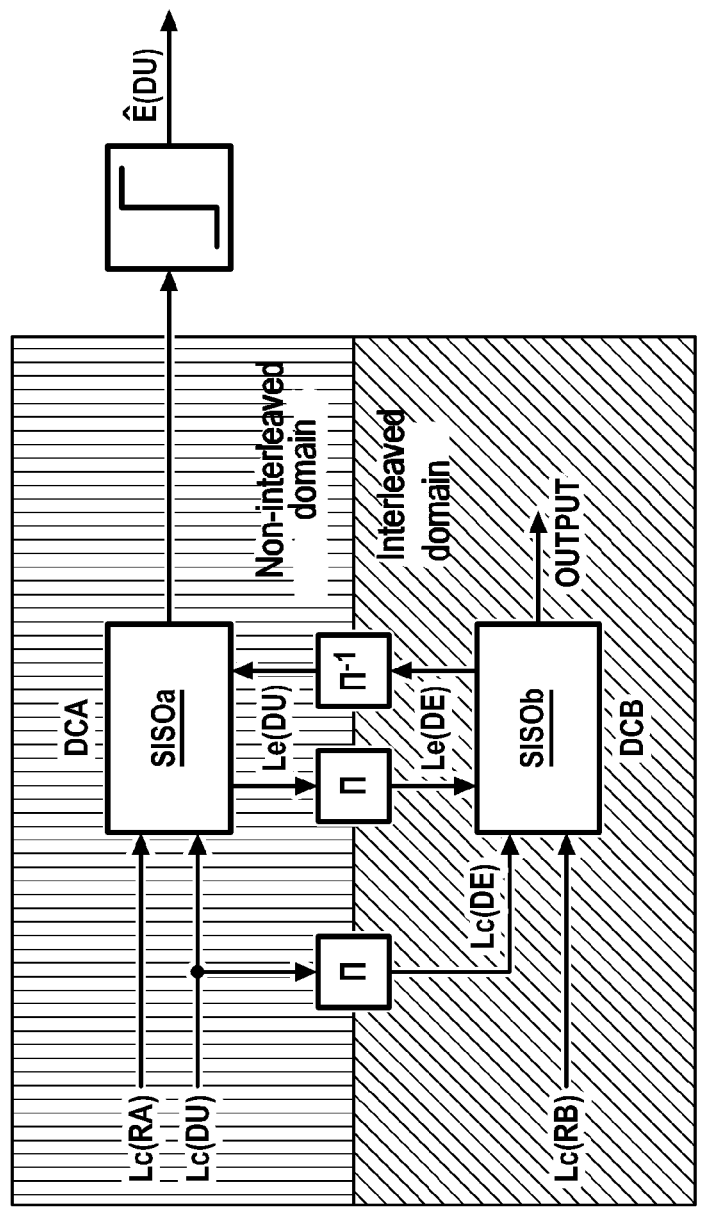

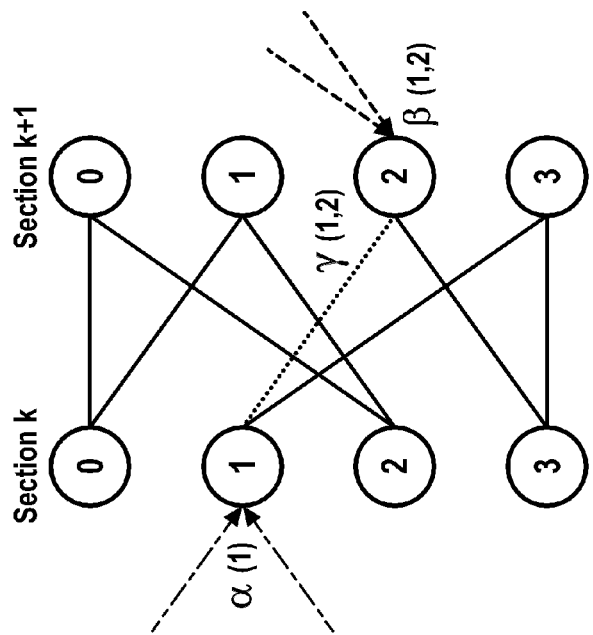
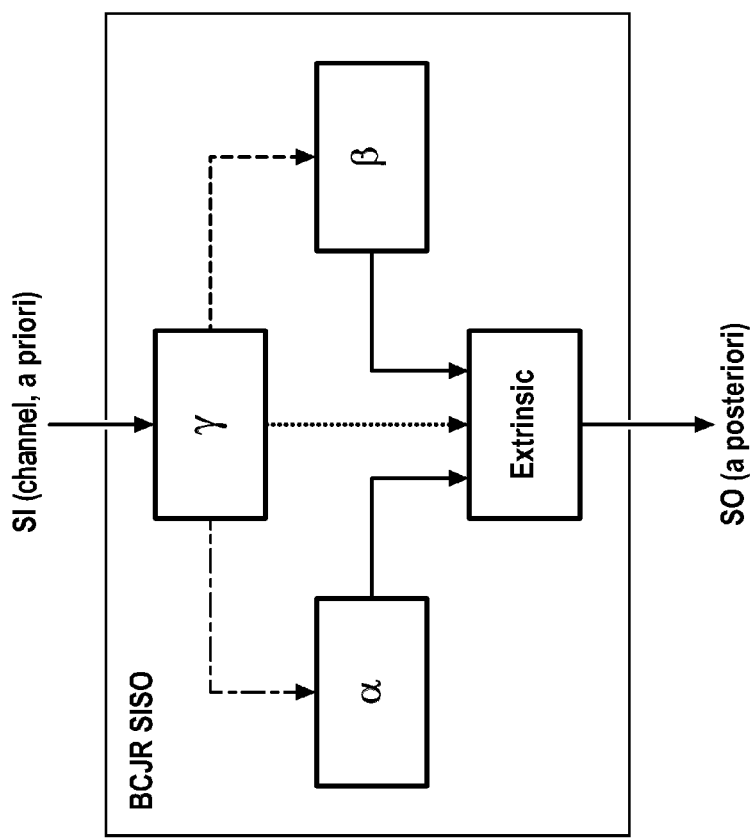
FIG. 3

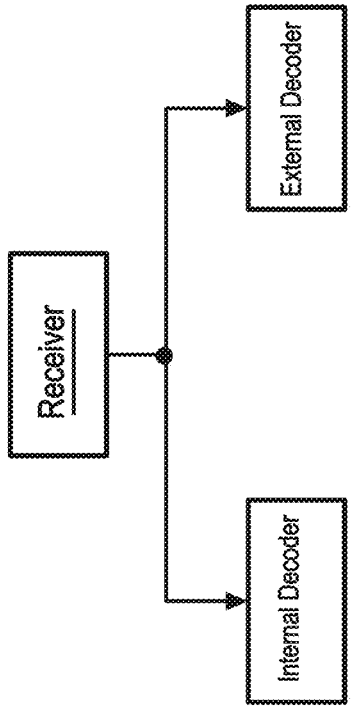
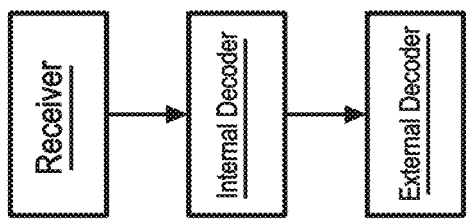

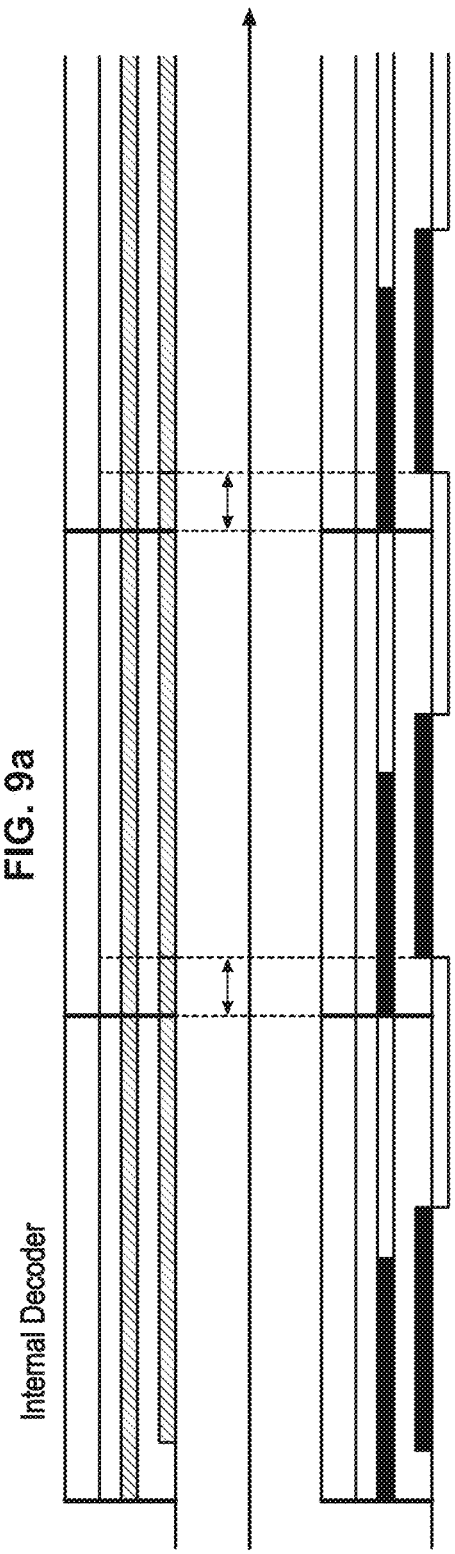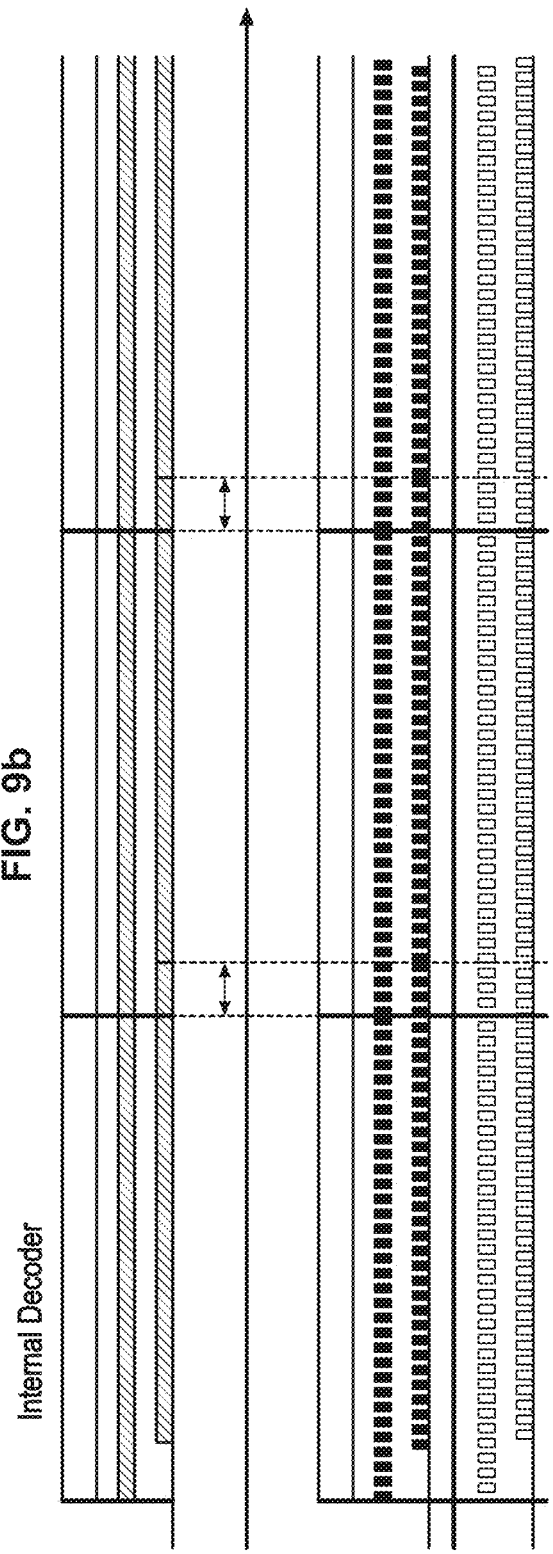

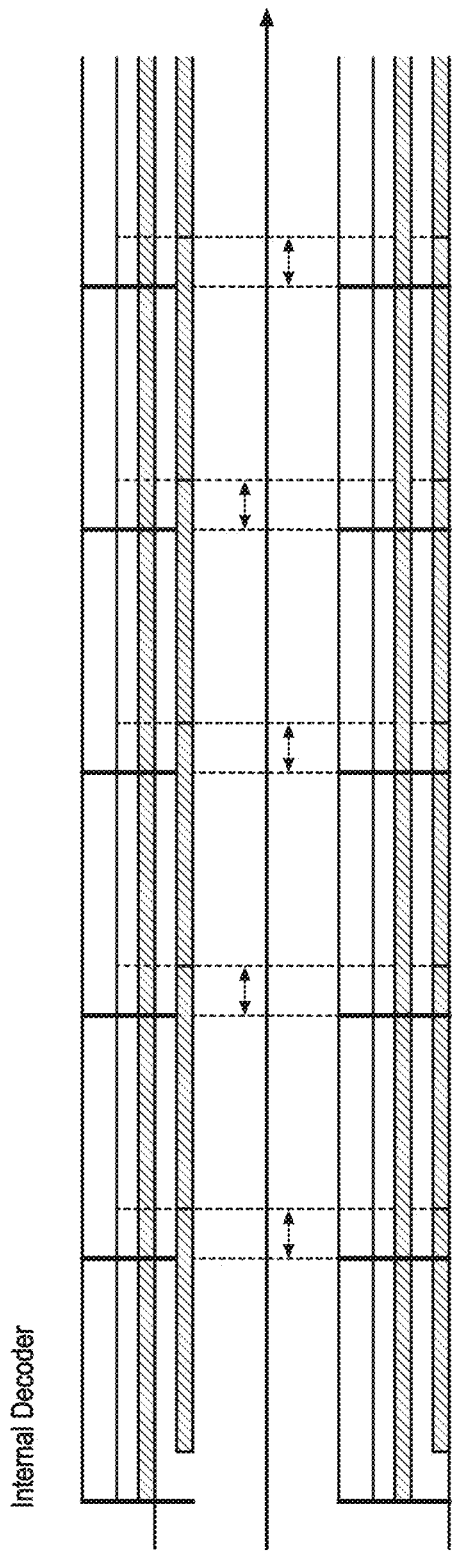

DECODING OF SERIES-CONCATENATED TURBO CODES

FIELD OF THE INVENTION

This invention relates to the field of digital telecommunications and more specifically the field of channel encoding, and in particular methods for decoding serial-concatenated convolutional codes. Channel encoding consists in using error-correcting codes that increase the level of redundancy of the transmitted information, to allow a better reproduction of the initial information on reception despite the errors introduced when this message is corrupted by its transmission through a propagation channel.

PRIOR ART

Parallel Turbo Codes and Product Turbo Codes

Error-correcting turbo codes first appeared in 1991 with the initial patent by Claude Berrou. The first versions originally used were parallel-concatenated convolutional codes (PCCC), a diagram of which is shown in FIG. 1a. Two conventional convolutional elementary (component encoder) encoders (known as component encoders, denoted CC) receive the informative or useful data (DU). The first component encoder (CCA) generates a first redundancy of r bits known as RA while the second component encoder (CCB) generates a second redundancy of r' bits known as RB. But beforehand the useful or informative data (DU) are passed through an interleaver n which predictably and reversibly mixes the sequence into interleaved data (DE) for the encoder CCB. The redundancy data are concatenated with the systematic data to form a parallel code word of (k+r+r') bits CP=[DU,RA,RB]. The redundancies can optionally be punctured, i.e. a part of them is dropped, in which case the redundancy is smaller. FIG. 2a shows a decoder of such a PCCC code. It contains two decoders DCA and DCB respectively associated with the encoder CCA or CCB as they are configured to determine the useful data most likely to have been originally sent according to the observation of the received code words from the channel. The decoder DCA receives the observations of the channel pertaining to the useful data DU and the first redundancy RA, while the decoder DCB receives the observations concerning the interleaved useful data DE and the second redundancy RB. Each decoder alone cannot find the solution. The collaboration of the two decoders is necessary and consists in alternating iterations of decoding by DCA and DCB which send one another estimates Le(DU) or Le(DE) according to whether one is in the interleaved domain or not, called extrinsic information items. The latter must be refined to allow the PCCC decoder to converge on the most likely solution since each decoder takes into account the preceding estimates of the other to establish its own.

Another type of turbo code is called a product turbo code. These codes possess the useful data DU in a table and encode each row and column using a fairly short linear code. With n columns and p rows, a horizontal encoding of r redundancies and a vertical one of r' redundancies, one obtains a table of (n+r) columns and (p+r') rows, i.e. a redundancy of pr+nr'+rr' for np useful data.

Serial-Concatenated Turbo Codes

There are other types of turbo codes based on two component encoders and an interleaving technique. The invention in particular pertains to serial-concatenated convolutional turbo codes (SCCC or Serial Concatenated Convolutional Codes) which have until now been less studied. They offer performance approaching the Shannon limit.

A serial-type concatenated turbo-encoder comprises two cascaded convolutional codes, hence its name, as shown in FIG. 1b. This turbo-encoder comprises a so-called external convolutional encoder CCE and a so-called internal convolutional encoder CCI. The external side deals with the informative or useful data, therefore outside a transmission and reception line, and the internal side deals with the propagation channel, therefore inside the line. The encoders are generally systematic convolutional codes (RSC for Recursive Systematic Code). An encoder is said to be systematic when the data provided to be encoded are found in the output code word alongside additional redundancies. These data present at the input and at the output are then known as systematic data. An interleaver Π is positioned between the output of the external encoder and the input of the internal encoder. A description thereof can be found in the article: S. Benedetto and G. Montorsi, "Serial concatenation of block and convolutional codes, "Electronics Letters, vol. 32, no. 10, pp. 887-888, 1996.

Serial concatenation of interleaved convolutional codes forming turbo-like codes, United States Patent US007.116710 B1, U.S. Pat. No. 7,116,710 B1 Jin et al. Date of Patent: Oct. 3, 2006. https://patents.google.com/patent/U.S. Pat. No. 7,116,710B1/en.

In the encoder SCCC, a word of systematic data of the external code known as external data DE (or useful data DU) comprising k bits of informative or useful data to be transmitted, is encoded by the external encoder CCE to obtain a code word CE=[DE,RE] comprising the k bits of informative data along with r redundancy or parity bits called external redundancy data RE. The bits of the code word CE are then interleaved by the interleaver n in order to obtain the systematic data word of the internal code known as internal data DI comprising k+r bits of internal data. As for all turbo codes, the interleaver mixes the bits to separate those which are consecutive in the external code word, such as to maximize the distance of the concatenated code. The interleaver is a reversible deterministic operation. The internal word DI is then encoded by the internal encoder CCI to obtain an internal code word CI=[DI, RI] comprising the k bits of useful data, the r bits of external redundancy data, interleaved into DI and r' additional redundancy bits added by the internal encoder CCI and known as internal redundancy data RI.

The word CI is then translated into symbols transmitted by a transmitter via a channel toward a receiver. The latter demodulates the signal and reconstitutes received raw signals R which are corrupted, i.e. they are for example affected by additive Gaussian thermal noise (AWGN or Additive White Gaussian Noise). Thus, the received code word R is representative of the energy level of the symbol carrying the encoding bit.

The decoding is done by an iterative decoder, the prior art of which is illustrated in FIG. 2b comprising an internal decoder DCI and an external decoder DCE cascaded in the reverse order to the encoder. The internal decoder DCI is associated with the internal encoder CCI since it determines the data most likely to have been encoded by the CCI. The external decoder DCE is associated with the external encoder CCE since it determines the data the most likely to have been encoded by the CCE. The iterative deoder also comprises a deinterleaver $\Pi^{-1}$ to deinterleave the exchanged elements of the interleaved domain, on the side of the internal decoder DCI to the non-interleaved domain, on the side of the external decoder DCE and an interleaver Π to once again interleave the elements exchanged in the other direction, from the external decoder DCE to the internal decoder DCI.

Soft Inputs and Outputs (Soft I/O)

The component decoders DCE and DCI have soft inputs and outputs. The soft inputs or outputs are also known by the expression "weighted input-outputs" or SISO (Soft-In Soft-Out). They quantify the estimate of the bit before or after decoding. In most embodiments, the soft information takes the form of an LLR (Log-Likelihood-Ratio). The sign of the LLR indicates whether the most probable bit is 1 or 0. The absolute value represents the probability ratio between the two and has the precise value of its logarithm. If the LLR has a value of 0, the probability of having a 0 or a 1 is identical, and thus has a value of ½.

In the remainder of the text L(XX) will denote the LLR of the turbo-decoder data referred to as XX in the encoder diagrams. This means although the turbo-decoder does not handle binary data as the encoder did, but handles an item of probability information pertaining to these same data, quantified by the LLR. These are sometimes inaccurately referred to as data in the turbo-decoder but the term in fact denotes information about these data, an estimate or probability of LLR type.

The inputs of the SISO component decoders are composed, on the one hand, of the LLRs of information items coming from the channel, i.e. the LLRs associated with the R demodulated symbols based on the received signal, also referred to as the intrinsic information items and denoted Lc(XX), and on the other hand, of the LLRs associated with the a priori probabilities (or estimates), i.e. characterizing the transmission statistics of the data, without considering the concerned encoding and denoted La(XX). More accurately, the intrinsic information represents a ratio of conditional probabilities, those of the reception of the raw symbol R according to whether the transmission assumption is 1 or 0. This information item therefore depends on the noise statistics and it has been proven that Lc has a value of $4R/No$ where No is the noise spectral density received in the case of a simple transmission of a bipolar symbol $\pm s(t)$ through an AWGN channel. The a priori probability in principle concerns the transmission statistics and is considered independent of the channel statistics. The result of this is that the transmission conditional probability ratio is the product of the two ratios and that its LLR has a value of Lc(XX)+La(XX). It is this pre-decoding information item, known as the conditional estimate, which is thus actually provided at the input to the SISO component decoders.

Their outputs are composed of the LLRs associated with the a posteriori probabilities (or estimates) L(XX), computed by the soft decoding algorithm used by the decoder. In practical terms, they represent a conditional probability ratio that takes into account the possible code words of the encoding in question. If the decoder DCI or DCE provides an a posteriori LLR equal to the conditional LLR Lc(XX)+La(XX), then the analysis has not provided any information. Thus, the formula L(XX)=La(XX)+Lc(XX)+Le(XX) makes it possible to define by subtraction the extrinsic information item denoted Le(XX) as the added value of the soft decoding algorithm by the decoder. The fundamental mechanism of turbo decoding is that the extrinsic information item provided at the output by a decoder is reinjected as the a priori probability at the input of the other decoder. This arrangement tends to make the algorithm converge since the estimates made by one take into account the estimates previously found by the other, as long as the transmitter was presenting a corresponding a priori probability.

Operation of the SCCC Decoder

The iterative (turbo) decoder must determine the informative or useful data most likely to have been originally injected into the serial-concatenated encoder. Each internal or external component decoder cannot find the solution alone. The so-called "turbo" technique therefore consists in making them collaborate by iterating a successive decoding of the DCI and of the DCE. At each execution, the decoders perform likelihood calculations according to their soft inputs and update their estimates of the bits of the code words in the form of LLRs. The latter refine and then converge on the most likely solution since each decoder takes into account the preceding estimates of the other to establish its own. The mechanisms of the SCCC or PCCC decoders are therefore essentially similar.

Hereinafter the inputs/outputs of FIG. 2b will be described in detail. The internal decoder DCI is fed at the input with the LLRs corresponding to the code word CI generated by the internal encoder CCI of (k+r+r') bits. The input of the internal SISO algorithm is a conditional LLR containing the intrinsic information item resulting from the demodulation of the channel Lc(CI) constituting the input INPUT of the turbo-decoder, and the extrinsic information item created at the output of the external decoder Le(CE), interleaved to become La(DI). This information item is set to zero at the start of the decoding, when it is considered that the source of data is equiprobable. If puncturing has taken place, the corresponding inputs which cannot be observed on the channel are also set to zero which corresponds to an equiprobability between 0 and 1. As the external code word CE has only (k+r) bits feeding the internal data DI of the encoder CCI, the La(DI) are fed by interleaving Π of the extrinsic information items Le(CE) coming from the DCE, when there is no La(RI) corresponding to the r' redundancy bits of the internal encoder.

The internal decoder DCI generates a posteriori probabilities concerning the internal data L(DI) composed of (k+r) bits. The DCI computes the a posteriori estimates that concern only the internal systematic data but not those concerning the redundancy data since they will not be transmitted to the external decoder which only possesses k+r inputs due to the way the code is constructed. The subtraction of the a priori LLR, presented as input, from the a posteriori LLR, generated as output of the DCI, provides the extrinsic information item added to the intrinsic information item of the channel (Lc+Le)(DI) related to the (k+r) systematic data bits of the CCI. It is transmitted to the deinterleaver $\Pi^{-1}$, thus becoming the conditional LLR (Lc+La)(CE) as input to the SISO algorithm of the external decoder, corresponding to the (k+r) bits of the external code word. The external decoder DCE generates a posteriori probabilities concerning the external code word L(CE) and the extrinsic information items Le(CE) are extracted therefrom by removing the conditional estimate from the input of the DCE. They correspond to k external systematic data bits and r external redundancy bits and are looped back to the DCI as already stated.

When the decoding stopping criterion is reached, the output OUTPUT is composed of a hard decision E(DU) provided by the sign of the LLR pertaining to the a posteriori estimate of the k external data bits. This estimate is therefore extracted from the external decoder.

It is notable that the two decoders of an SCCC are of a slightly different nature, contrary to what happens for a PCCC. Specifically, the internal decoder only computes extrinsic information items for its systematic data DI whereas the external decoder must also compute extrinsic information for its code word CE. This is imposed by the concatenated structure of the SCCC code for which the two encoders do not share the same size of systematic data but share an interface of k+r bits constituting both the code word of the external encoder CCE and the systematic data of the internal encoder CCI. When the external encoder is systematic, the a posteriori estimate of the code word is composed of that pertaining to its k systematic data DE and that pertaining to its r redundancy bits RE. In addition, the DCE is fed with the outputs of the DCI, released according to its operating speed and a sequence rendered pseudo-random by intermediate deinterleaving. The absence of pure intrinsic information item as input to the DCE thus does not allow its meaningful execution as long as the extrinsic information item is not released by the DCI.

Trellis Component Decoder

Trellis representation is the conventional way of representing a convolutional code. At each step k, an input datum $D_k$ causes a transition from the current state of the encoder $E_k$ to another state $E_{k+1}$ along with the creation of output data $C_k$ forming the code word (a code of ratio ½ provides 2 bits with 1 input bit). The associated decoders make use of the coding trellis structure in which the internal states, or leaves, are represented by discs and the transitions, or branches, by arrows connecting them. The most popular trellis decoding algorithm is the Viterbi algorithm. This seeks the most probably code word, i.e. it searches for a solution according to the maximum likelihood criterion ML (Maximum Likelihood). The SOVA (Soft Output Viterbi Algorithm) version can take into account a priori probabilities and provides LLRs for each bit of the code word by comparing the metrics in the vicinity of the optimal solution of the ML criterion. However, the BCJR algorithm is a more effective SISO for decoding turbo codes.

It is an algorithm for decoding error-correcting codes defined by a trellis which provides an a posteriori probability of each bit and therefore a solution according to the maximum a posteriori criterion MAP. The algorithm bears the name of its inventors: Bahl, Cocke, Jelinek and Raviv. This algorithm is essential for modern error-correcting codes decoded iteratively, including turbo codes and LDPC codes. It was first described in: L. Bahl, J. Cocke, F. Jelinek, and J. Raviv, "Optimal Decoding of Linear Codes for minimizing symbol error rate", IEEE Transactions on Information Theory, vol. IT-20(2), pp. 284-287, March 1974.

The principles of this algorithm are summarized in FIG. 3. In the step k, i.e. the transition between the sections k and k+1 of the trellis, it computes three metrics: $\gamma$ characterizes the transition from the state $E_k$ to $E_{k+1}$ and is a function of the LLRs $L_a(C_k)$ and $L_c(C_k)$; $\alpha$ is characteristic of all the paths arriving at the node $E_k$ and $\beta$ of all the paths departing from the node $E_{k+1}$. The APP of the symbol of index k (A Posteriori Probability) which therefore provides $L(C_k)$ is a function of the metric $(\alpha+\beta+\gamma)$ for all the transitions of the trellis. The metric $\alpha$ is constructed by recurrence in a direct progression (forward, increasing k) based on the sums $(\alpha+\gamma)$ over the transitions arriving at the nodes of index k whereas $\beta$ is constructed by recurrence in a backward progression (backward, decreasing k) based on the sums $(\beta+\gamma)$ over the transitions arriving at the nodes of index k+1. In practice, one round trip is therefore needed over the k indices to carry out one execution of the BCJR.

Execution Times of SCCC Decoders

One full decoding cycle with the two decoders DCI and DCE results in the reproduction of the most probable useful or informative data, owing to several successive iterations. An iteration is defined as the duration of one full exchange in the outward direction and the return direction between the two decoders (internal and external) of internal and external extrinsic information items relating to all the data of the word to be decoded. An execution is defined as the time taken to update all the extrinsic data at the output of a single decoder, DCE or DCI, so in this case, one round trip of the trellis by the BCJR algorithm.

A time interval is the elementary time period between the production of two successive extrinsic information items by a SISO decoder, such as the DCI or the DCE. The time internals have a different typical duration for the DCI and DCE dependent on the hardware architecture used (CPU, clock, memories, FPGA . . . ). Each iteration comprises a certain number of time intervals, depending on the number of extrinsic information items to be exchanged by iteration.

The iterations stop when a convergence criterion is reached. The criterion is defined in such a way as to obtain the certainty that the two component decoders have found a solution which does indeed constitute a code word for the two internal and external decoders. The number of iterations of one full cycle is therefore essentially variable, and may depend on the noise level affecting the data of the channel. If the duration of one full cycle is TC, the decoder has provided k information bits in a time TC and can hence start a new cycle with a new code word. Its instantaneous throughput is therefore of k/TC bits/second. Its average throughput depends on the average of the cycle time TC and therefore on the average number of iterations.

To guarantee a minimum throughput for the decoder, a maximum number of iterations can be set for it as an additional stopping criterion in such a way as to guarantee a maximum cycle time. If this number is attained at a time when the convergence criterion has not yet been attained, the trade-off is that the data probably have an error rate greater than the rate obtained when this criterion is attained.

To increase the throughput of a turbo decoder, several approaches are possible: the most trivial way consists in replicating decoders and executing them in parallel with consecutive code words. There is no inventive step in such a parallel device. The resources used (number of electronic gates) are proportional to the number of replicas and the cycle time is unchanged. Another approach consists in reducing the cycle time. First the elementary time interval can be reduced. This basically equates to seeking a piece of hardware with as fast a clock speed as possible, or the one whose elementary cell makes the most computations in one clock tick, which has no connection with this invention. Next, the execution time of a component decoder can be reduced. A great deal of research exists on this subject.

Finally, one may seek the architecture and information exchange sequence, of the channel or extrinsic, which makes it possible to reduce the number of iterations to convergence on the criterion. This invention makes provision for such mechanisms, significantly reducing the iteration time.

Architectures and Sequencing of Turbo Decoders.

In the original turbo-decoder schemes, each decoder waited for a word to be entirely decoded by the other decoder before using its extrinsic data. In the simplest architecture for the PCCC decoder of FIG. 2a, there is only one physical implementation of component decoder. Since the two decoders are generally similar, the configuration of the component decoder as DCA or DCB depends only on configuration parameters. The component decoder therefore alternates between executions of DCA and DCB. One may start with DCA or DCB interchangeably. One iteration lasts for two executions and the extrinsic information exchanges take place at the end of each execution.

In the architecture of the prior art FIG. 2b which shows the prior art of the SCCC, as described by E. Boutillon, C. Douillard, and G. Montorsi, "Iterative decoding of Concatenated Convolutional Codes: Implementation Issues", Jan. 29, 2007, Proceedings of IEEE, one must of necessity begin with a first execution of the internal decoder DCI before the external decoder DCE can start the first decoding of the word. Specifically, a dependency exists, since the external decoder DCE is connected to the outputs of the DCI. The size of the code word of the DCI is of necessity greater than that of the DCE because of the serial concatenation. The two serial component decoders can have the same code, but even in this case, unlike PCCC decoders, they take up different amounts of hardware resources, since the external decoder estimates both the systematic bits and the redundancy bits of its inputs whereas the internal decoder estimates only the systematic bits of its inputs. In addition, the trellis depth of each of the two serial component decoders is different (different size of the code word), which can manifest as a different use of memory resources.

Two decoders can be implemented separately, but then each one waits for the other. The resulting wait times increase the cycle time and consequently reduce the overall decoding rate.

Techniques have been put in place to accelerate parallel or product turbo codes as in FIG. 2a. In these encodings, the code words of the two encoders CCA and CCB transmit their outputs to the channel and none is injected into the other, so the decoding can start with one or the other decoder interchangeably, since this manifests as an independent reception of the code words by the two decoders directly from the channel. A known way of accelerating the decoding is to parallelize it, as in the following article: D. Divsalar and F. Pollara, "Multiple Turbo Codes for Deep-Space communications", JPL TDA Progress Report pp 71-78, May 1995. In this article, the two decoders DCA and DCB are implemented separately, at the time of its first execution, the DCA decodes a first code word and the DCB the second code word comprising the same interleaved information bits. Therefore the two decoders decode the same information bits but with a different start owing to the interleaving . . . In practice, this decoding technique proves inefficient. Examining its operation more closely, it can be seen that two chains of decoding are done in parallel (DCA-DCB-DCA . . . and DCB-DCA-DCB . . . ) without ever exchanging extrinsic information items until the end of an iteration. This technique makes it possible to somewhat reduce the decoding time since one of the chains converges more quickly, but it uses twice the resources. In the end, a purely parallel architecture, i.e. one duplicating the resources to process two different code words, will be more effective for increasing the throughput.

In the literature, several studies have been conducted to make high-throughput turbo-decoders using different parallelism techniques. Most of the literature relates to the PCCCs of C. Berrou in which the practical implementation of parallelism is adapted to the parallel nature of the concatenation, and few contributions are devoted to serial concatenations. In the article: M. Martina, A. Molino, F. Vacca, G. Masera, and G. Montorsi, "High throughput implementation of an adaptive serial concatenation turbo-decoder", Journal of Communications Software and Systems, vol. 2, p. 252, April 2017, a parallel architecture of 16 concurrent SISO decoders was proposed, based on the sliding window parallelism technique which consists in dividing each frame into M sub-blocks and associating each sub-block with a SISO decoder proposed in the article: Schurgers, F. Catthoor, and M. Engels, "Memory optimization of map turbo decoder algorithms", IEEE Transactions on Very Large Scale Integration (VLSI) Systems, vol. 9, no. 2, pp. 305-312, 2001.). In the article: R. Shoup, "Hardware implementation of a high-throughput 64-ppm serial concatenated turbo decoder", vol. 6311, August 2006, pp. 63 110S-63 110S, the hardware implementation of a high-throughput Max Log Map SCCC decoder for an optical channel is proposed. Parallelism was introduced both into the metric computations of the states in SISO decoders and using sliding windows. In the previous contributions, the parallelism introduced into the SCCC decoders was intended to accelerate the computations of metrics, but not the exchange of extrinsic information items which is crucial to further increasing the decoder throughput.

The so-called "shuffled" decoding technique proposed in the article: Juntan Zhang and M. P. C. Fossorier, "Shuffled iterative decoding", IEEE Transactions on Communications, vol. 53, no. 2, pp. 209-213, 2005 and the associated U.S. Pat. No. 7,373,585, consists in accelerating the exchanges of extrinsic information items between the component decoders of a concatenated system. More precisely, the technique consists in creating multiple replicas of sub-decoders. Each of the sub-decoders is called a "group-shuffled sub-decoder". In each group-shuffled sub-decoder the estimates of bits or symbols which are updated by a conventional iterative decoder are partitioned into groups. The decoder using the "shuffled" technique uses the outputs of its sub-decoders as follows. Each time a bit or a symbol value or a message is updated in each group-shuffled sub-decoder, a certain number of other bit or symbol values or messages are used to make the update. The other bit or symbol values or messages are obtained using the estimates provided by the "group-shuffled sub-decoder" that has most recently updated this bit or this symbol value or this message. The idea is to accelerate the convergence of the iterative decoding, and therefore the throughput of the decoder. Decoding using the "shuffled" technique has been applied to several types of decoder, as suggested by Juntan Zhang and M. P. C. Fossorier, for LDPC and PCCC codes. In the article: C. Argon and S. W. Mclaughlin, "A parallel decoder for low latency decoding of turbo product codes", IEEE Communications Letters, vol. 6, no. 2, pp. 70-72, 2002, the authors have a parallel decoding approach to Turbo Product Code (TPC) to increase the throughput while keeping the same error rate. This approach has been generalized to LDPCs and PCCCs under the name of "Shuffled" technique. In the article: Y. Lu and E. Lu, "A parallel decoder design for low latency turbo de-coding", Second International Conference on Innovative Computing, Information and Control (ICICIC 2007), 2007, pp. 386-386, the authors present a parallel decoding algorithm for a PCCC decoder based on the research presented in the article by Zhang and M. P. C. Fossorier. In the article: O. Muller, A. Baghdadi, and M. Jezequel, "Exploring parallel processing levels for convolutional turbo decoding", 2006 2nd International Conference on Information Communication Technologies, vol. 2, 2006, pp. 2353-2358, the authors explore and analyze parallelism techniques in parallel turbo-decoding, including the "shuffled" decoding technique. The "shuffled" decoding algorithm for SCCC does not appear to have been addressed in the literature.

SUMMARY OF THE INVENTION

The invention makes provision for remedying the aforementioned drawbacks. It particularly makes it possible to reduce the idle periods of the different decoders and thus to reduce the latency time of the decoding without necessarily proportionately increasing the hardware resource used.

In this regard, the invention makes provision, according to a first aspect, for an error-correcting serial turbo-decoder comprising an input configured to receive a word to be decoded comprising intrinsic information items pertaining to useful data, external and internal redundancy data, at least one internal decoder configured to implement a SISO algorithm and one external decoder configured to implement a SISO algorithm. One of the internal decoders and the external decoder is configured to receive in parallel the intrinsic information items of the channel pertaining to a word to be decoded at the start of each decoding cycle. The internal decoder is configured to carry out a part of the decoding of the word based on the intrinsic information items pertaining to the useful data, and the internal and external redundancy data. The external decoder being configured to carry out another part of the decoding of the word based on the intrinsic information items pertaining to the useful data and the external redundancy data.

In an embodiment, the internal decoder is configured to generate internal extrinsic information items based on intrinsic information items which are provided to it, as stated, and external extrinsic information items when the external decoder is configured to generate the external extrinsic information items based on the intrinsic information items which are provided to it and on the internal extrinsic information items.

This turbo-decoder thus allows the external decoder to begin the decoding of a word directly, without awaiting the end of the decoding by the internal decoder. The convergence speed is therefore faster than that obtained with a conventional serial-concatenated turbo-decoder.

In an embodiment, the serial turbo-decoder further comprises a memory area (MEM-E) storing intermediate variables used by the external decoder, a memory area storing intermediate variables used by the internal decoder and a memory area (MEM-X) storing the internal extrinsic information items and the external extrinsic information items.

In an embodiment, the external decoder is configured to generate, at least twice, the external extrinsic information items when the internal decoder generates, once, the internal extrinsic information items.

In an embodiment of the turbo-decoder, the latter contains two internal decoders (DCI-a and DCI-b) and one external decoder DCE. A first input is related to the first internal decoder (DCI-a) and to the external decoder (DCE). The serial turbo-decoder comprises a second input receiving a second word to be decoded and related to the second internal decoder (DCI-b) and to the external decoder (DCE). The second word also comprises useful data, and internal and external redundancy data. The first internal decoder is configured to generate internal extrinsic information items of the first word based on the intrinsic information items of the useful data, on the internal and external redundancy data of the first word, and on external extrinsic information items relating to the first word. The second internal decoder is configured to generate internal extrinsic information items of the second word based on the intrinsic information items of the useful data, on the internal and external redundancy data of the second word and on external extrinsic information items relating to the second word. The external decoder is configured to generate, on the one hand, external extrinsic information items of the first word based on the intrinsic information items of the useful data and on the external redundancy data of the first word and on the internal extrinsic information items deinterleaved from the first word and to generate, on the other hand, external extrinsic information items of the second word based on the intrinsic information items of the useful data and on the external redundancy data of the second word and on internal extrinsic information items deinterleaved from the second word.

In an embodiment, the external decoder is configured to generate, once, the external extrinsic information items of the first word and the external extrinsic information items of the second word when the first internal decoder generates, once, the internal extrinsic information items of the first word and the second internal decoder generates, once, the internal extrinsic information items of the second word. It has a memory area (MEM-Ia) storing intermediate variables used by the first internal decoder, a memory area (MEM-Ib) storing intermediate variables used by the second internal decoder, a memory area (MEM-Xa) storing the internal extrinsic information items of the first internal decoder and the external extrinsic information items to decode the first word, a memory area (MEM-Xb) storing the internal extrinsic information items of the second internal decoder and the external extrinsic information items to decode the second word and finally a memory area (MEM-E) storing intermediate variables used by the external decoder.

In an embodiment, the serial turbo-decoder further comprises a partitioning of the memory area (MEM-E) into (MEM-Ea) storing intermediate variables used by the external decoder to decode the first word, a memory area (MEM-Eb) storing intermediate variables used by the external decoder to decode the second word. The external decoder follows any order using two instances each working for a different code word during the same iteration, for example as a "round robin".

In an embodiment, the external decoder DCE implements an algorithm of Radix-m type and the internal decoder DCI implements an algorithm of Radix-$m^p$ type, where m advantageously has a value of 2 for binary data, and p is an integer number not exceeding n which is the number of data of the external code word per external systematic datum. In other words, 1/n is the efficiency of the external encoder CCE associated with the external decoder DCE.

In an embodiment the internal decoder is configured to generate internal extrinsic information items based on the external extrinsic information items in addition to the intrinsic information items which are provided to it and the external decoder is configured to generate external extrinsic information items based on the internal extrinsic information items in addition to the intrinsic information items which are provided to it.

In an embodiment the external decoder is configured to start a decoding and produce extrinsic information items based on the intrinsic information items without awaiting the availability of extrinsic information items of the internal decoder and the internal decoder is configured to start a decoding and produce extrinsic information items based on the intrinsic information items without awaiting the availability of extrinsic information items of the external decoder.

In an embodiment the external decoder (DCE) is configured to generate, at least twice, new external extrinsic information items when the internal decoder (DCI) generates, once, the internal extrinsic information items.

In an embodiment the serial turbo-decoder further comprises a memory area storing intermediate variables used by the external decoder, a memory area storing intermediate variables used by the internal decoder and a memory area storing the internal extrinsic information items and the external extrinsic information items.

In an embodiment the internal decoder is a first internal decoder and the input is a first input. The serial turbo-decoder comprises at least a second internal decoder and a second input receiving a second word to be decoded sent in parallel to the external decoder, which also comprises intrinsic information items pertaining to useful data, and external and internal redundancy data. The first internal decoder is configured to generate internal extrinsic information items of the first word based on the intrinsic information items of the first word and on external extrinsic information items of the first word and the second internal decoder is configured to generate internal extrinsic information items of the second word based on the intrinsic information items of the second word and on external extrinsic information items of the second word. The external decoder is configured to generate external extrinsic information items of the first word based on the intrinsic information items of the first word and on internal extrinsic information items of the first word and also to generate external extrinsic information items of the second word based on the intrinsic information items of the second word and on internal extrinsic information items of the second word.

In an embodiment the external decoder is configured to generate, once, the external extrinsic information items of the first word and the external extrinsic information items of the second word when the first internal decoder generates, once, the internal extrinsic information items of the first word and the second internal decoder generates, once, the internal extrinsic information items of the second word.

In an embodiment the serial turbo-decoder further comprises a first memory area able to store intermediate variables used by the external decoder, a second memory area able to store intermediate variables used by the first internal decoder, a third memory area storing intermediate variables used by the second internal decoder, a fourth memory area storing the internal extrinsic information items of the first internal decoder and the external extrinsic information items to decode the first word and a fifth memory area storing the internal extrinsic information items of the second internal decoder and the external extrinsic information items to decode the second word.

In an embodiment, the first memory area is partitioned into at least two memory sub-areas, with a first sub-area able to store the intermediate variables used by the external decoder DCE to decode the first word, a second sub-area able to store the intermediate variables used by the external decoder to decode the second word, the external decoder being configured to follow any order of execution using at least two instances which each work for a different code word during one and the same iteration.

In an embodiment the data of the internal encoder are m-ary and the efficiency of the external encoder is 1/n before puncturing, where n is an integer greater than or equal to 2, the external decoder (DCE) implements an algorithm of Radix-m type and the internal decoder (DCI) implements an algorithm of Radix-$m^p$ type, with p an integer less than or equal to n.

In an embodiment a number of instances of DCI is less than $m^{n-p}$.

The invention makes provision, according to a second aspect, for a method for serial turbo-decoding of a word to be decoded comprising useful data, and internal and external redundancy data, the method comprising a step of receiving intrinsic information items by an external decoder and an internal decoder of the word, a step of internal decoding of the word based on the intrinsic information items pertaining to the useful data, internal and external redundancy data and a step of external decoding of the word based on the intrinsic information items pertaining to the useful data and the external redundancy data. The step of internal decoding is carried out by the internal decoder using a SISO algorithm, the external decoding step being carried out by the external decoder using a SISO algorithm, the internal decoding step and the external decoding step beginning simultaneously.

The invention makes provision, according to a third aspect for a computer program product comprising program code instructions for executing the steps of the serial turbo-decoding method when the latter is executed by a processor.

DESCRIPTION OF THE FIGURES

Other features and advantages of the invention will become apparent from the following description, which is purely illustrative and non-limiting and must be read with reference to the appended figures wherein:

FIG. 1a, described previously, shows a parallel turbo-encoder. The two convolutional encoders CCA and CCB each generate a respective redundancy RA and RB which are concatenated with the useful data. The encoder CCA has its systematic data directly fed by the useful data, whereas the encoder CCB sees the useful data interleaved before becoming its systematic data.

FIG. 1b, described previously, shows a serial turbo-encoder. The useful data are the systematic data provided to the external encoder CCE and the external code word CE that it generates is interleaved to become the systematic data DI provided to the internal encoder CCI. The code word CI generated by the internal encoder is the information transmitted by the channel over modulated symbols. The latter are received affected by noise, the demodulated raw signals R provide the intrinsic information items as input to the turbo-decoder SCCC.

FIG. 2a, described previously, shows a parallel turbo-decoder of the prior art. The decoder DCA that works in the deinterleaved domain, receives the intrinsic information items of the channel, denoted Lc(X), concerning the useful data and the redundancy of the encoder CCA, when the decoder DCB which works in the interleaved domain, receives the intrinsic data of the channel concerning the interleaved useful data and the redundancy of the encoder CCB. At each iteration, the decoder DCA provides the decoder DCB with its useful extrinsic information items that must be interleaved beforehand when the decoder DCB provides the decoder DCA with its interleaved extrinsic information items which should then be deinterleaved. When the turbo-decoder satisfies the convergence conditions, the "hard" useful data are estimated based on the useful extrinsic information items.

In FIG. 2b, the integers associated with the LLR labels indicate the number of data associated with the information stream.

FIG. 3 shows a decoder according to the BCJR algorithm with, on the left, the cell for computing the parameters α, β and γ for each section of the trellis and, on the right, a representation of the trellis transitioning from the state #1 for the step k to the state #2 for the step k+1. The metric α characterizes the set of paths arriving at the node #1 of the step k, the metric γ characterizes the transition from the state #1 to the state #2 and the metric β characterizes all the paths coming from the node #2 of the step k+1.

FIG. 4 displays a butterfly via each arrow denoting a stream timed to synchronize with other information items.

FIG. 5 The arrows of FIG. 5 show the succession of processing steps. FIG. 5-a shows a serial turbo-decoding method of the prior art when FIG. 5-b shows a serial turbo-decoding method according to the invention. The decoding steps of the DCI (502 and 502') and of the DCE (503 and 503') are consecutive to the step of distributing the intrinsic information items of the channel, but in the invention, the decoding step DCE does not await the end of the decoding DCI.

FIG. 7-b shows another operating timing diagram of the serial turbo-decoder of the invention. In this embodiment, the external decoder DCE is restarted a second time as soon as it has finished its first execution without awaiting the end of the execution of the internal decoder DCI. During this second execution the latter uses the most recent available extrinsic information items.

In FIG. 8-a the memory areas MEM-X and MEM-I y are duplicated with an index a to store the computations concerning the first code word and an index b for the computations of the second code word. Both the DCI have access to the memories of their respective indices when the single DCE has access to both indices. In FIG. 8-b, the memory MEM-E is also duplicated and each instance of the decoder DCE accesses both the memory area indices to process the first and second code word separately.

FIGS. 9-a and 9-b each show another operating timing diagram of the serial turbo-decoder of the invention, according to the respective set-ups of the FIGS. 8-a and 8-b. In FIG. 9-a, during an iteration, the decoder DCI-a is executed a single time while the decoder DCE is executed a first time by exchanging extrinsic information items with the DCI-a for the first code word then a second time by exchanging extrinsic information items with the DCI-b for the second code word. In FIG. 9b, the DCE is executed alternatively with two instances respectively processing the information items of the first and of the second code word, for a small number of time intervals.

FIG. 11 shows another operating timing diagram of the serial turbo-decoder of the invention, according to the diagram of FIG. 10. In relation to FIG. 7a, the difference is that the execution time of the decoders DCE and DCI are similar.

DETAILED DESCRIPTION OF THE INVENTION

Figure 2B:
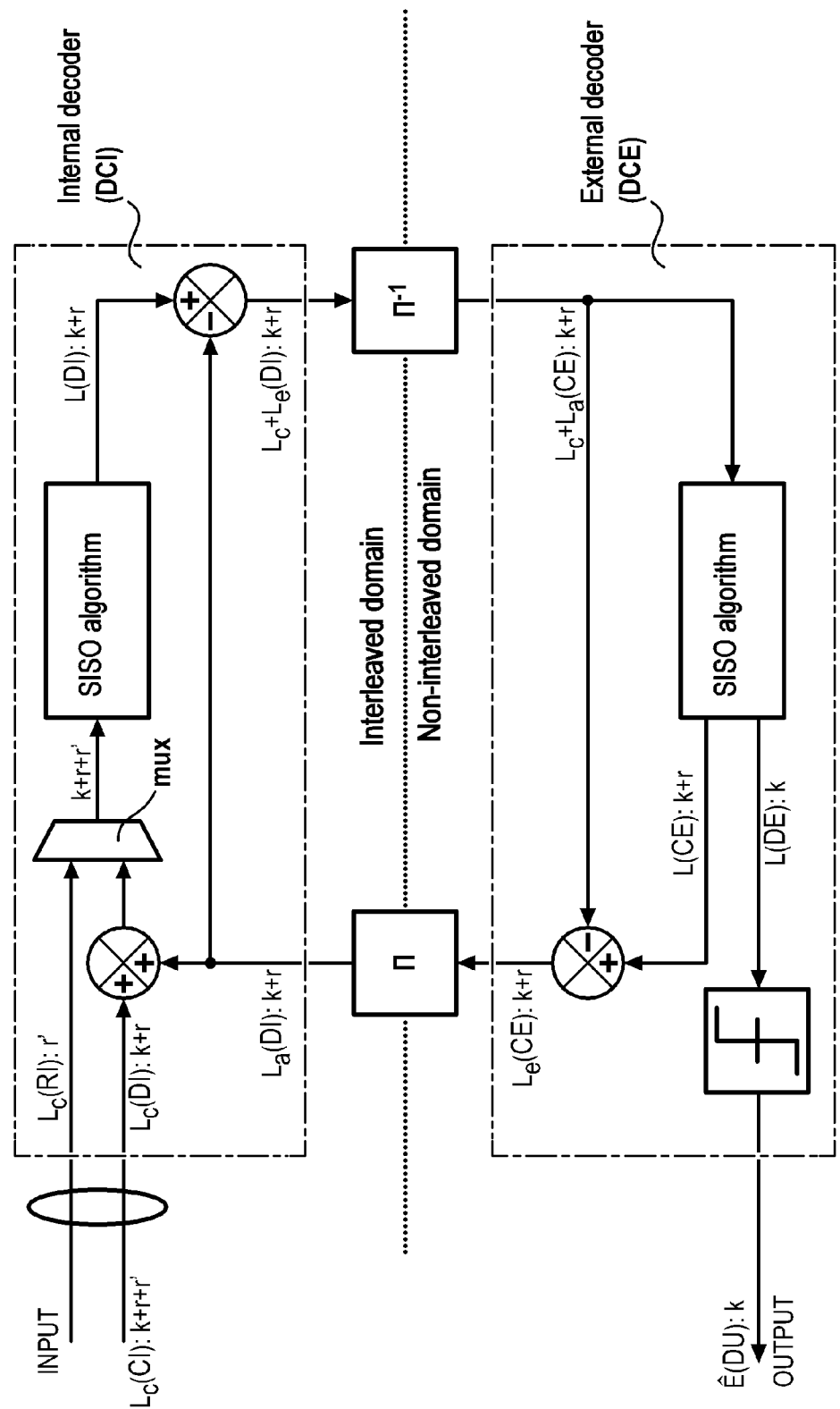
FIG. 2b, described previously, shows a conventional serial turbo-decoder. The decoder DCI which works in the interleaved domain, receives the intrinsic information items of the channel concerning the internal code words CI. At each iteration, the decoder DCI provides the decoder DCE with the conditional estimates that must be deinterleaved from external data into the external code word CE. Reciprocally, at each iteration, the decoder DEC which works in the deinterleaved domain provides the decoder DCI with its extrinsic information items which should then be interleaved with the external code word into internal data. The "hard" useful data E(DU) are reproduced based on the a posteriori estimates on the external systematic data.

The invention makes provision for increasing the throughput and energy efficiency of SCCC decoders using a decoding technique of "shuffled" type which advantageously benefits from an interconnection scheme making it possible to break the feed hierarchy of the DCE through the DCI, as described previously, as well as methods for ordering component decoders making it possible to reduce their idle period owing to the parallel processing of the code words.

FIG. 1-b schematically represents a transmission line using a serial turbo code as error-correcting code (FEC, Forward Error Correction). The useful data DU are encoded by the encoder SCC then converted into symbols by the modulator, transmitted over the noisy channel, received by the receiver, then demodulated into noisy raw symbols. The serial turbo-decoding device (or serial iterative decoder) receives the data in the form of a frame comprising a plurality of consecutive words. Typically, the turbo-decoder comprises a processing unit such as a processor to implement a computer program able to perform serial turbo-decoding of the words of the frame, and also a memory to store, among other things, the words of the frame and of the intermediate variables needed for the serial turbo-decoding. In an embodiment, the data processing unit is a programable logic circuit (programmable logic array, FPGA for Field-Programmable Gate Array) or a dedicated circuit such as an ASIC (Application Specific Integrated Circuit). This logic array generally includes memory. In another embodiment, the processing unit is a CPU (Computer Processing Unit) card which combines memory and a multi-core processor making it possible to perform several computing operations in parallel, or a GPU (Graphics Processing Unit) card which uses a specialized processor for parallelized graphic processing.

The mission of the turbo-decoder is to find the code word CI transmitted by the transmitter by observing the received symbols R affected by noise that can be thermal and disturbances related to the propagation channel between the transmitter and the receiver.

This transmitted word CI comprises k useful or informative data, r redundancy data generated by the external encoder CCE and r' redundancy data generated by the internal encoder CCI.

The term "word" should be understood to mean a finite sequence of bits, regardless of their nature (full code word, consistency, redundancies, etc). These words can be concatenated into a frame of successive words.

In the remainder of the text, it is considered that the external encoder CCE has an efficiency 1/n, i.e. for each encoded datum, the codeword contains n data. The puncturing of the code word has the effect of reducing this value which can no longer be integer, but it will be considered hereinafter that the impact of this puncturing does not alter the general reasoning done on the code before puncturing. Usually, the device is presented in the case of an efficiency of ½ but those skilled in the art know how to modify the described device to adapt it to other efficiencies.

Generally, the inputs, outputs and extrinsic information items of the turbo-decoder are soft data, estimating probabilities expressed in the form of a log-likelihood ratio (LLR), as opposed to hard data, i.e. binary data, as handled by the turbo-encoder.

The LLR estimates resulting from the observation of the symbols after the demodulation of the channel, presented at the input of the turbo-decoder, are referred to as intrinsic information items. The extrinsic information items are obtained by subtraction of the estimates at the input of the decoder from the estimates at the output of the decoder. They therefore express a variation in likelihood after the decoding operation for each component decoder.

Figure 4:
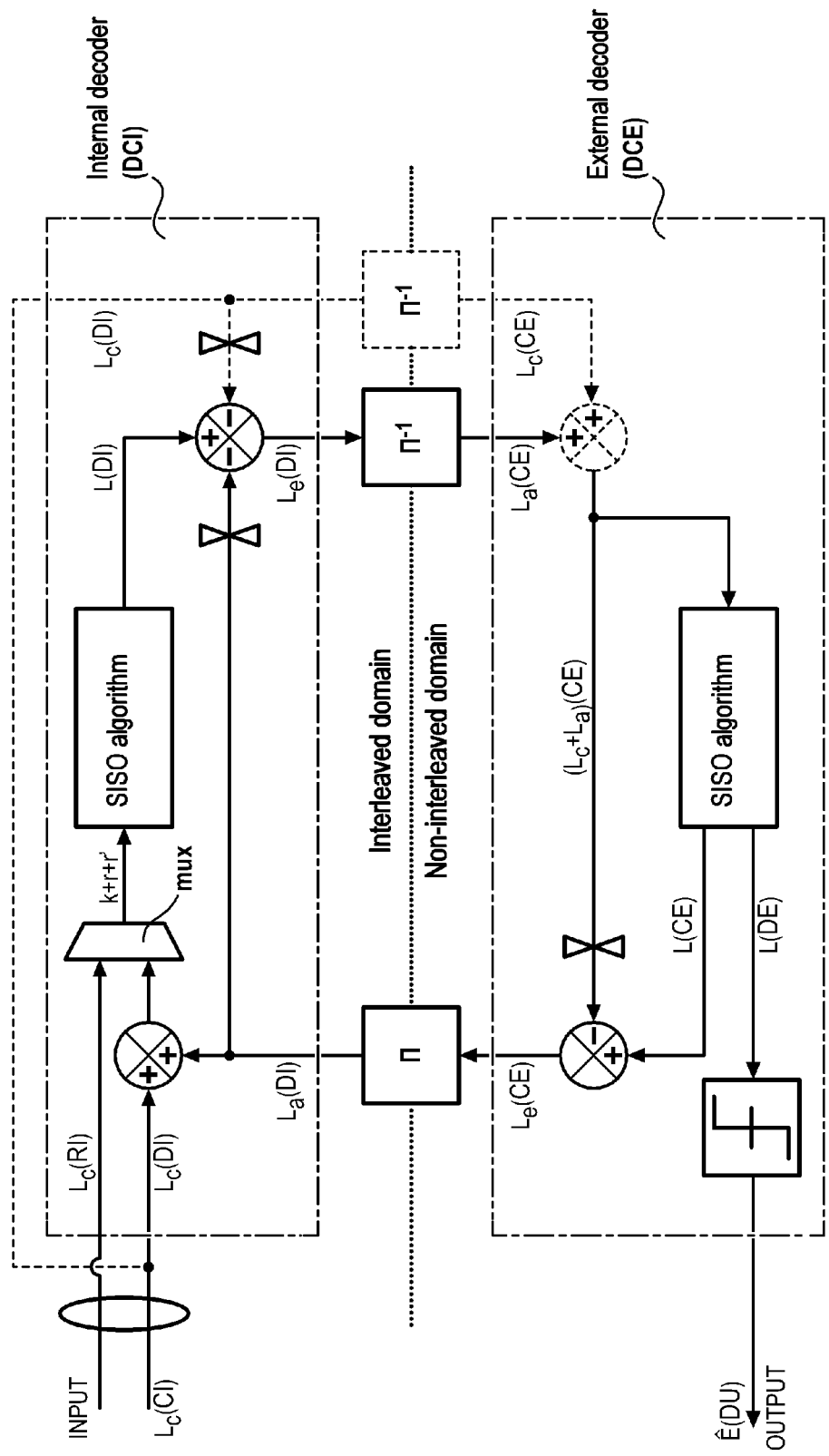
FIG. 4 shows an embodiment of the serial turbo-decoder of the invention. The device added to that of FIG. 2-b is as follows. The portion of the intrinsic information items of the channel concerning the systematic data of the internal decoder short-circuits the internal decoder DCI to then feed the inputs of the external decoder DCE. They are removed beforehand from the a posteriori estimates provided by the DCI, to only keep extrinsic information items. The external conditional estimate used as input to the DCE is then formed by summing the intrinsic and a priori information item pertaining to the external code word, obtained after deinterleaving.

FIG. 4 shows a serial turbo-decoder according to an embodiment of the invention, in which it is implemented on a FPGA, a dedicated circuit or a processor. In this embodiment the serial turbo-decoder comprises an input INPUT related to an internal decoder DCI and to an external decoder DCE, so that the two decoders can simultaneously receive the intrinsic information item of the channel Lc.

Thus, the internal decoder receives the intrinsic information item Lc(CI) while, via a simple deinterleaving of the systematic part Lc(DI), the external decoder DCE receives the intrinsic information item Lc(CE). The two SISO decoding algorithms are thus fed with the conditional estimate combining this intrinsic information item with the extrinsic information item then available from the other decoder.

This modification of interconnection of the serial turbo-decoder is made possible owing to the systematic nature of the codes generated by the internal encoder of the serial turbo-encoder, i.e. the latter creates an internal code word which contains the external code word. The external code can not be systematic, without any restriction for the scope of the invention. In this case, the external decoder presents an output of useful data DU different from the a posteriori estimate outputs pertaining to its code word. However, in general, each encoder is of RSC (Recursive Systematic Code) type.

During all the iterations and even each time interval, the external decoder DCE and the internal decoder DCI simultaneously decode their respective code word, in order to generate a posteriori estimates, from which the extrinsic information items are extracted. These extrinsic information items will be exchanged just after their production, during the iteration even, i.e. the concept of information exchange is used with a "shuffled" architecture, in its broader sense.

During an iteration, the internal decoder DCI generates k+r internal extrinsic information items associated with the k+r systematic data of the internal code based on the k+r+r' intrinsic information items of the channel for the internal code word and on the k+r external extrinsic information items generated by the DCE during the current or preceding iteration.

During an iteration the external decoder DCE generates k+r external extrinsic information associated with the k+r data of the external code word based on k+r intrinsic information items of the channel for the external code word and on the k+r internal extrinsic information items generated by the DCI during the current or preceding iteration.

The k+r intrinsic information items at the input of the DCE are obtained by selecting the intrinsic information items of the channel corresponding to the systematic data of the internal encoding DI that must be deinterleaved. Here the intrinsic information items have therefore been dropped from the internal redundancy. Moreover, the k+r external extrinsic information items, once interleaved, become the a priori estimate of the systematic part of the internal code. Thus, the DCI does not have any extrinsic information items corresponding to the internal redundancy RI. In addition, the k+r internal extrinsic information items, once deinterleaved, become the a priori estimate of the external code word. Thus, the DCE possesses extrinsic information items for all its data, including the external redundancy.

Advantageously the external decoder DCE and the internal decoder DCI use a decoding algorithm of the "maximum a posteriori" type (MAP), for example using the BCJR (Bahl, Cocke, Jelinek and Ravi, after the names of the inventors) algorithm, as shown in FIG. 3. The decoding computes metrics in the form of LLRs based on probabilities of transition from a node of one section to those of the following or preceding section, since the BCJR explores the trellis in both directions. Typically, any implementation of the BCJR allows the processing unit to compute the node and branch metrics by working through all the branches connecting the nodes of one section to those of the following or preceding section in one fixed and relatively short time interval, corresponding to a small number of cycles of the clock signal which sets the rate for the processing unit.

During each time interval, the internal decoder DCI investigates a section of the trellis of the internal encoding and generates the internal extrinsic information item associated with the systematic data of this section. As, in principle, the trellis of the internal encoder processes one systematic datum per section, it generates one extrinsic information item per time interval.

During each time interval, the external decoder DCE investigates a section of the trellis of the external encoding and generates the external extrinsic information item associated with the data of the code of this section. This results in the DCE generating n external extrinsic information items per time interval and if the external encoder is systematic, one of them corresponds to a systematic datum when the n−1 others correspond to the external redundancy data.

The interconnection modification allows the external decoder DCE to be independent of the internal decoder DCI and to start its decoding simultaneously with that of the internal decoder DCI. In the diagram 2-b, it had to await the end of the decoding of the latter and the production of its internal extrinsic information item Le(DI), but with the interconnection of FIG. 4, the use of the intrinsic data pertaining to the external code word during the first iteration makes a posteriori estimates produced by the DCE meaningful, even when the internal extrinsic information item is fully or partially unavailable at its input. These extrinsic information items arrive at the external decoder DCE, not only later, but also in a very different sequence from the arrival of the corresponding internal intrinsic information items, since the decoder DCI has its own sequencing logic to work through the trellis, both in direct and backward directions. Thus, operations of subtraction of the intrinsic information item Lc(DI) before deinterleaving then of addition of this same intrinsic information item Lc(CE) after deinterleaving do not cancel one another out since they occur according to a very different chronological order. The butterflies of FIG. 4 indicate that the intrinsic information items will subsequently be removed when the corresponding internal a posteriori information items are available.

Figure 6:
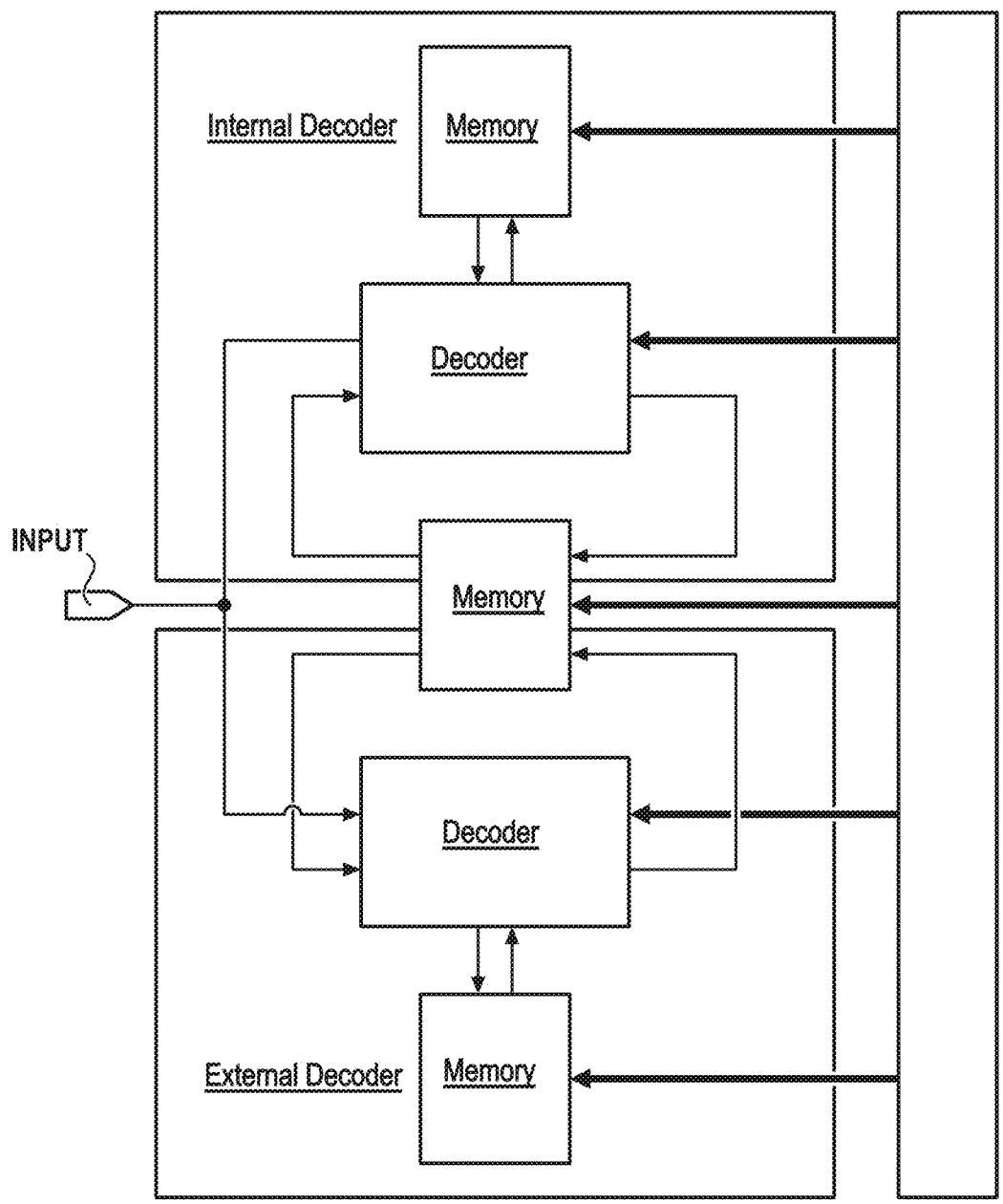
FIG. 6 shows an implementation of the decoder with two specialized separate decoders; one executes the algorithm of the DCI when the other executes the algorithm of the DCE. The input INPUT indicates the arrival of the intrinsic information items of the channel. MEM-X denotes the exchange memory serving to exchange the extrinsic information items between the two decoders. MEM-I and MEM-E respectively denote the own memories of each decoder, DCI and DCE, to store its intermediate computations.

In FIG. 6 the device also comprises:
- an internal own memory area MEM-I used to store the intermediate variables α and β of the BCJR algorithm of the internal decoder DCI,
- an external own memory area MEM-E used to store the intermediate variables α and β of the BCJR algorithm of the external decoder DCE,
- an exchange memory area MEM-X used to store the internal and external extrinsic information items exchanged between the internal decoder DCI and the external decoder DCE.

FIG. 5 shows a serial turbo-decoding method according to an aspect of the invention. FIG. 5-a illustrates the sequencing for a conventional SCCC decoder and FIG. 5-b the sequencing for an SCCC decoder according to the invention.

The conventional serial turbo-decoding method comprises for each iteration:
- a step 501 of receiving by the internal decoder DCI intrinsic information items concerning the code word CI to be decoded,
- a step 502 of internal decoding used to generate, based on the intrinsic information items of the channel and on the external extrinsic information items, new internal extrinsic and intrinsic information items,
- a step 503 of external decoding used to generate, based on the sum of the internal extrinsic and intrinsic information items, new external extrinsic information items.

The serial turbo-decoding method according to the invention comprises for each iteration:
- a step 501' of receiving by the internal DCI and external DCE decoder intrinsic information items respectively concerning the code words CI and CE to be decoded,
- a step 502' of internal decoding used to generate, based on the intrinsic information items of the channel and on the external extrinsic information items, new internal extrinsic information items,
- a step 503' of external decoding used to generate, based on the intrinsic information items of the channel and on the internal extrinsic information items, new external extrinsic information items.

The steps 502 and 502' of internal decoding are carried out by the internal decoder DCI and the steps 503 and 503' of external decoding are carried out by the external decoder DCE. Whereas the steps 502 and 502' are formally identical, the steps 503 and 503' differ in their input information items. In the conventional architecture, the step 503 of external decoding of necessity follows the step 502 of internal decoding.

On the other hand, in the architecture of the invention, the step 502' of internal decoding and the step 503' of external decoding begin simultaneously and are carried out in parallel, which significantly accelerates the speed of the turbo-decoder.

The external decoder DCE has a shorter trellis length to be decoded than those of the internal decoder DCI. Specifically, the internal decoder has k+r systematic data which correspond to the size of the code word to be processed by the external decoder. As the external decoder DCE has an efficiency of 1/n, the external decoder DCE will have n times less systematic data to process than the internal decoder DCI. Assuming, which is the usual implementation, that the DCE, just like the DCI, have a trellis having one systematic datum (or encoding datum if the CCE is not systematic) per section, they are of radix-2 for a binary datum. The external decoder DCE will therefore use n times more time intervals to carry out its decoding than the internal decoder DCI. The time intervals being fundamentally similar for a given material technology, the execution of the DCE will go n times faster than that of the DCI.

Figure 7A:
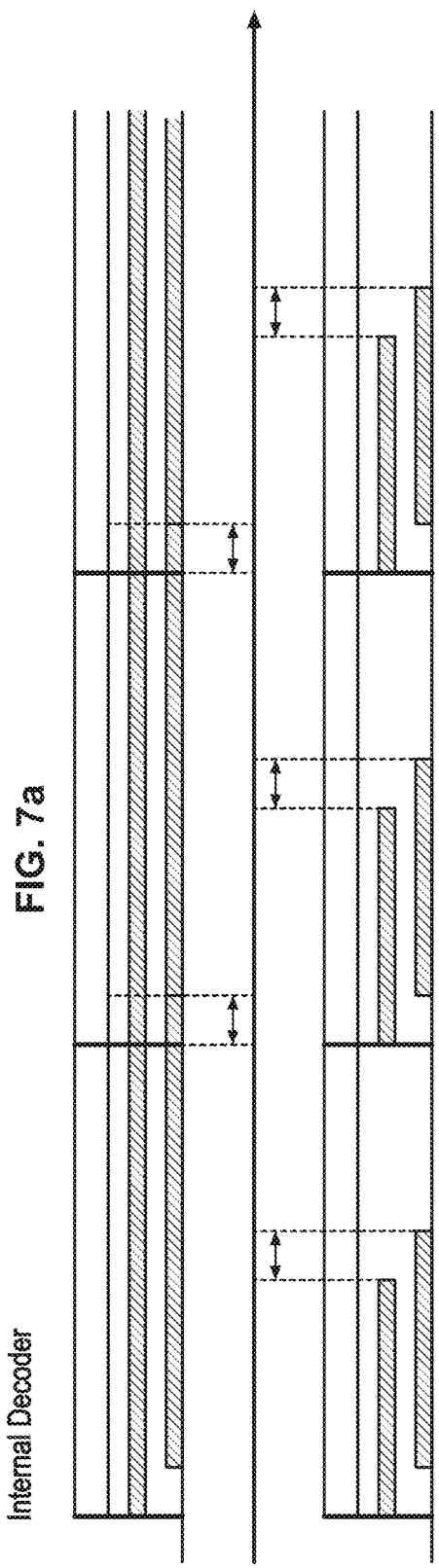
FIG. 7-a shows an operating timing diagram of the serial turbo-decoder of the invention. The internal decoder DCI has an execution time which is twice as long as that of the decoder DCE. Thus, the latter awaits the end of the execution of the DCI so that all its updated extrinsic information items are available.
Figure 7B:
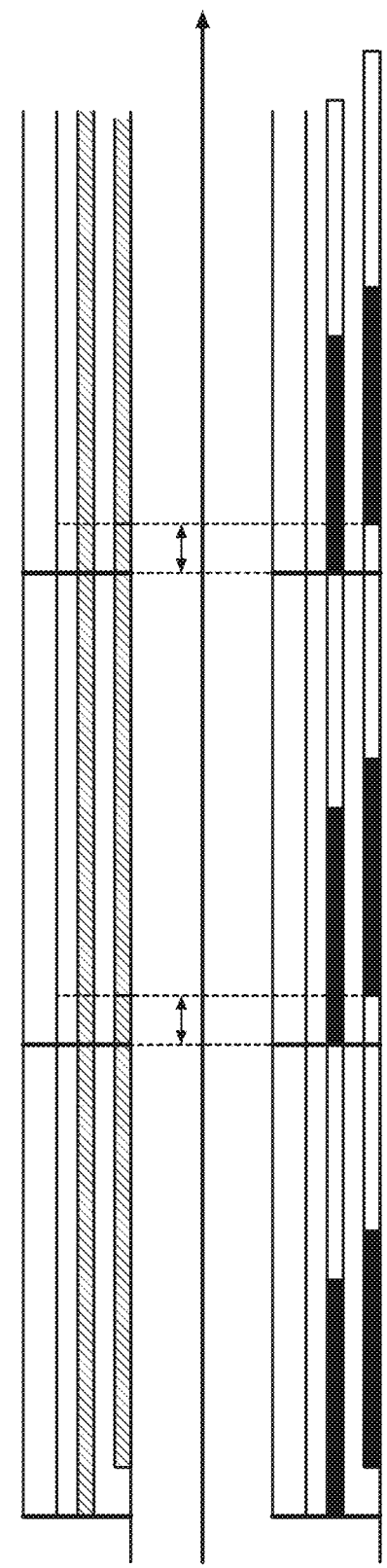

Thus, in FIG. 7-a, n has a value of 2 and for each iteration, the external decoder DCE only carries out a decoding during half the time of one iteration.

The aim of the invention, in general, is to make it so that the DCE of the decoder is always used without having to await the end of the execution of the DCI or DCIs that are associated with it. It has been seen that the interconnection modification that short-circuits the DCI to feed the DCE with the intrinsic information items of the channel removes the obstacle limiting the performance of a conventional SCCC turbo-decoder. Several sequencing strategies are then possible and the associated embodiments are described below.

We have just seen that the DCE has its own execution time which is approximately n times faster than that of the DCI. To optimize the decoding, FIG. 7-b shows an embodiment wherein the external decoder DCE carries out n times in succession the decoding of the same word over one and the same iteration, thus making it possible to obtain a more reliable external extrinsic information item. This is possible on condition that it takes advantage of each new execution of internal extrinsic information items partially re-updated by the DCI as it performs its own execution. This external extrinsic information item is then used again by the internal decoder DCI during its execution, in the same iteration or the following iteration. This architecture can only be advantageous for a serial turbo-decoder since, for a parallel decoder, the own execution times of the DCA and DCB are identical, like the number of sections of their encoding trellis, since they have the same number of systematic data (see FIG. 2-a). In FIG. 7-b, n has a value of 2 and the efficiency of the CCE is of ½.

Thus, in this implementation, the external decoder DCE operates successively n times over the same iteration. This solution does not require any added resources, it simply offers an optimized solution by comparison with those already available and offers better performance since it converges more quickly.

Another strategy consists in duplicating n times the internal decoder DCI for a single implemented decoder DCE. Each internal decoder DCI then receives a word to be decoded over n consecutives and feeds at the output the same DCE. The n words to be decoded are therefore processed by the sole external decoder DCE, the execution time of which is partitioned according to a chosen order.

Figure 8A:
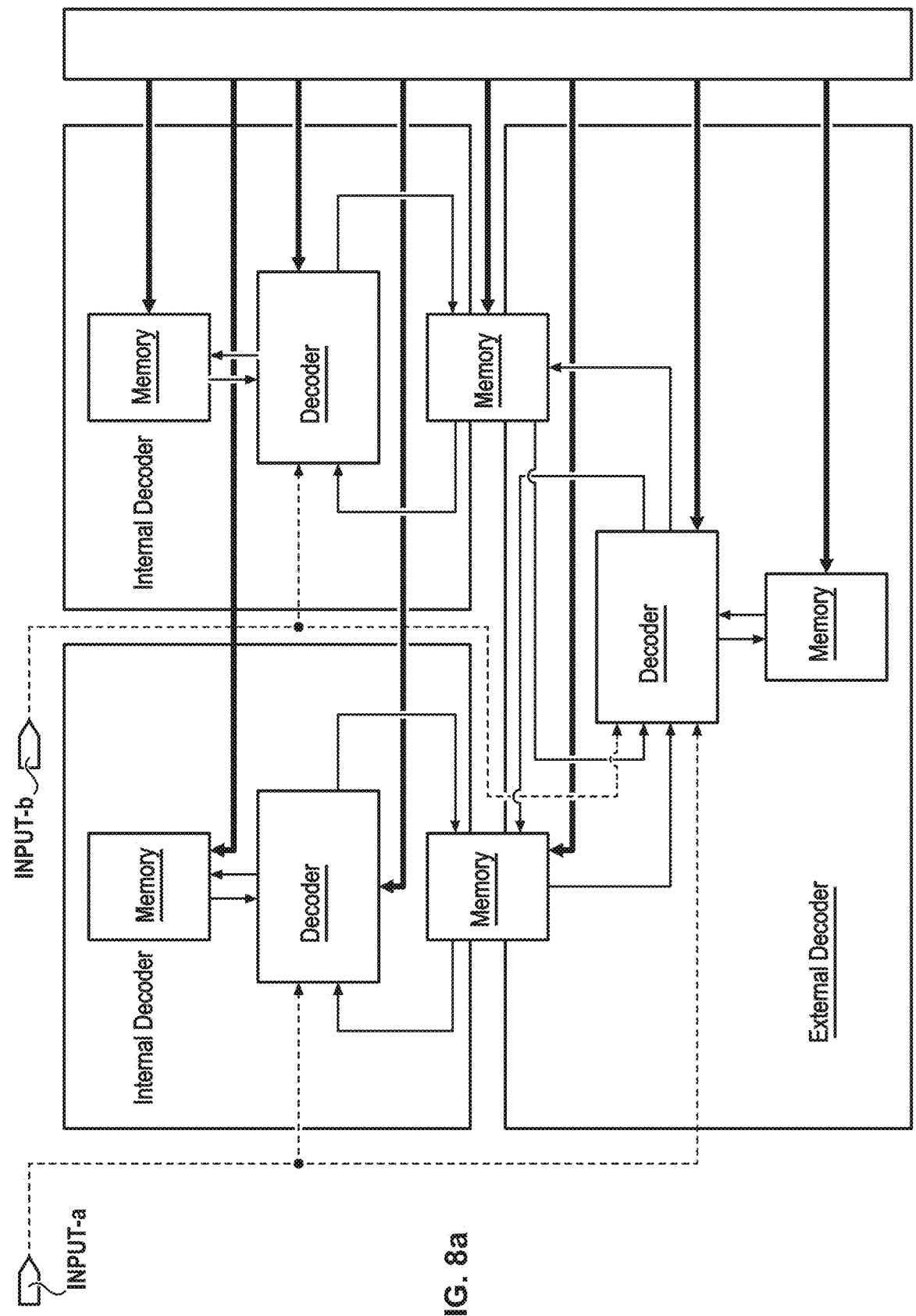
FIGS. 8-a and 8-b show another embodiment of the serial turbo-decoder of the invention in which are implemented two internal decoders DCI-a and DCI-b which execute the internal decoding algorithm and an external decoder DCE. INPUT-a and INPUT-b indicate the input of the intrinsic information items of the channel respectively for the first and second code word of the transmitted data.
Figure 8B:
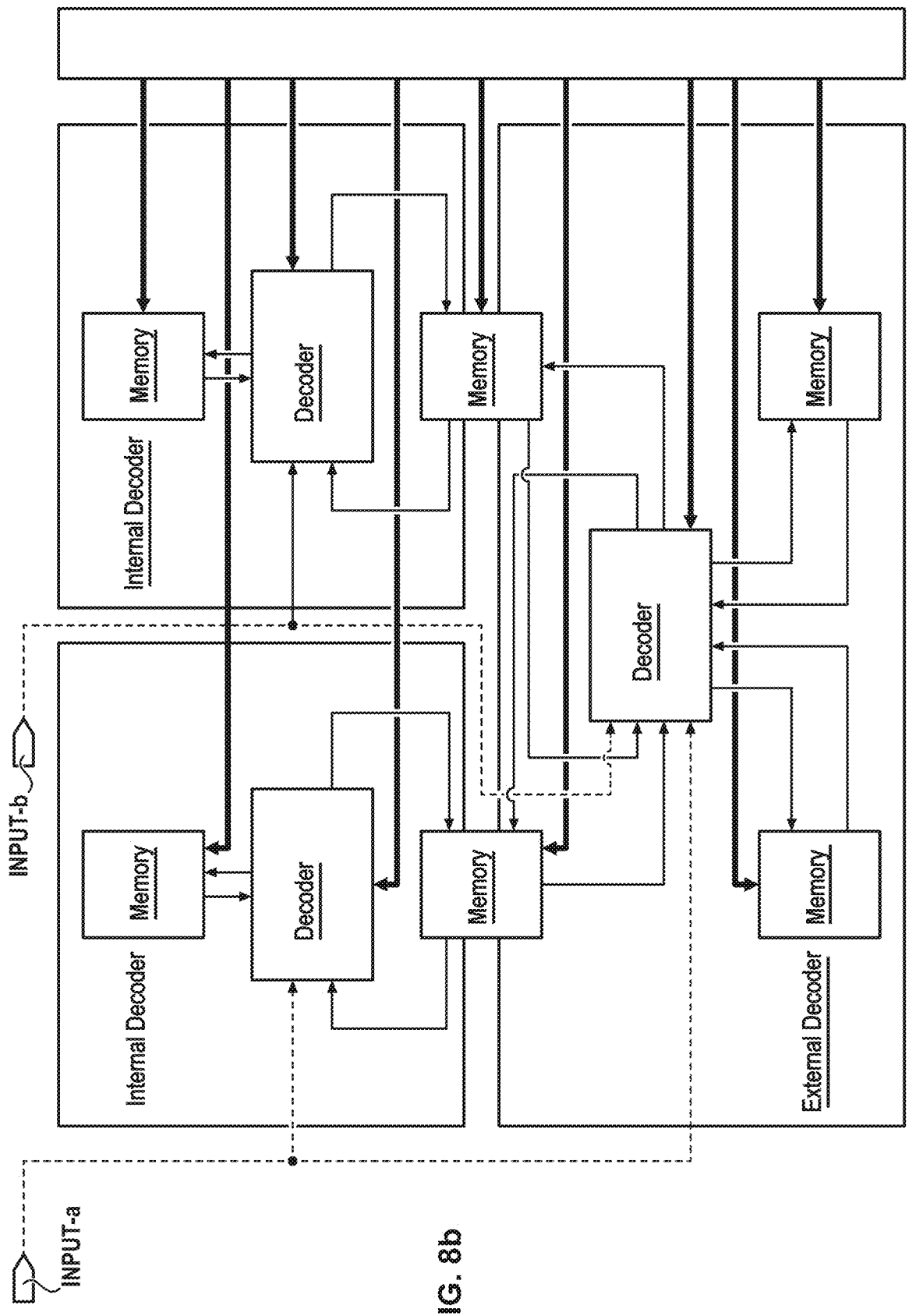

FIGS. 8-a and 8-b thus show a second embodiment in which n has a value of 2 and the efficiency is ½. The internal decoder DCI is then doubled, so that two different words can be decoded in parallel, one by the first internal decoder DCI-a and the other by the second internal decoder DCI-b.

In this implementation, the single external decoder DCE performs the external decoding for both internal decoders DCI-a and DCI-b.

The serial turbo-decoder comprises two inputs INPUT-a and INPUT-b. The input INPUT-receives a first word and is connected to the first internal decoder DCI-a and to the external decoder DCE. The input INPUT-b receives a second word and is connected to the second internal decoder DCI-b and to the external decoder DCE.

This embodiment makes provision for two levels of parallelism:
  Parallelism in the processing since the decoding of a word is done simultaneously by an internal decoder and an external decoder, just like in the architecture of FIG. 6. It is therefore a concurrent parallel decoding.
  an additional parallelism of the processed data since two different words are decoded simultaneously owing to the use of two internal decoders and a shared external decoder.

In this embodiment, the serial turbo-decoder simultaneously decodes two independent words using two internal decoders DCI-a and DCI-b and a single external decoder DCE.

Returning to an efficiency of 1/n, in a first sub-embodiment, the simplest time ordering consists in dividing the duration of one full iteration of the DCI into n equal successive parts and allocating each part to the decoding of any one of the n words. For example, in FIG. 9-a, the external decoder DCE is used in the first half-iteration to decode the first word and in the second half-iteration to decode the second word.

This embodiment requires a multiplication of the resources of the internal decoder, including its internal own memory area MEM-I, and a multiplication of the size of the exchange memory area MEM-X used to store the internal and external extrinsic information items, shared with the single external decoder. This multiplication is by a factor n.

The device for an n value of 2 therefore comprises:
  an external own memory area MEM-E used to store the intermediate variables α and β of the BCJR algorithm of the external decoder DCE,
  an internal own memory area MEM-Ia used to store the intermediate variables α and β of the BCJR algorithm of the first internal decoder DCI-a,
  an internal own memory area MEM-Ib used to store the intermediate variables α and β of the BCJR algorithm of the second internal decoder DCI-b,
  an exchange memory area MEM-Xa used to store the internal and external extrinsic information items exchanged between the first internal decoder DCI-a and the external decoder DCE,
  an exchange memory area MEM-Xb used to store the internal and external extrinsic information items exchanged between the second internal decoder DCI-b and the external decoder DCE.

It is not necessary here to multiply by a factor n the external own memory area used to store the intermediate variables α and β used by the external decoder, since the processing of the consecutive code words is sequential and permits the overwriting of the data of the first word, the decoding of which is finished when the decoding of the second word begins. The resources dedicated to the decoder DCE, both the own memory and the computing unit alike, are therefore not increased, which constitutes an advantage for the efficiency of the implementation.

FIG. 9-a corresponding to the implementation of FIG. 8-a shows the activity timing diagram of the operation of the external decoder DCE, when it uses the first half-iteration to decode the first word and uses the second half-iteration to process the second word.

However, FIG. 8-b in fact shows a second sub-embodiment of the serial turbo-decoder for which the implementation of the internal decoder DCI is duplicated. In this sub-embodiment, the external own memory area is also duplicated as MEM-Ea and MEM-Eb. These memories are configured to store, for the one, the intermediate variables α and β of the BCJR algorithm of one instance of the external decoder DCE which decodes the first word and, for the other, the intermediate variables α and β of the BCJR algorithm of another instance of the external decoder DCE which decodes the second word.

Returning to the general case of an efficiency of 1/n, this sub-mode also requires multiplying by n the external own memory area MEM-E, as already done for the number of internal decoders DCI and the exchange memory area MEM-X. Thus designed, this implementation makes it possible to simultaneously decode n consecutive words, according to any time-based ordering which no longer makes it necessary to complete the decoding of a code word before starting the decoding of the following word. It is then said that the decoder DCE is instanced n times.

In this embodiment the external decoder can be used at any time in the same iteration to decode any of the n words processed during this iteration. To do this, it suffices for it to use a portion of exchange memory MEM-X dedicated to this word for the exchange with the internal decoder DCI which is in charge of its decoding as well as the portion of external own memory MEM-E which is also dedicated to it for storing its metrics and intermediate parameters. After a few time intervals, the DCE can switch to the decoding of any other code word without the risk of overwriting metrics or intrinsic information items.

This sub-embodiment, although requiring an additional multiplication of the external own memory portion of the DCE, proves to offer the advantage of offering better convergence performance than the preceding sub-embodiment. To obtain such an advantage with this sub-embodiment, one may, for example, choose for the DCE to work successively on each decoding instance during the same small number of successive time intervals, before passing onto the following instance according to a round robin which makes several rounds. The timing diagram of this sub-embodiment is shown in FIG. 9-b.

Thus in this embodiment, the device with n having a value of 2 as shown in FIG. 8-b comprises:
  an external own memory area MEM-Ea used to store the intermediate variables α and β of the BCJR algorithm of the external decoder DCE for the instance that processes the first code word,
  an external own memory area MEM-Eb used to store the intermediate variables α and β of the BCJR algorithm of the external decoder DCE for the instance that processes the second code word,
  an internal own memory area MEM-Ia used to store the intermediate variables α and β of the BCJR algorithm of the first internal decoder DCI-a that processes the first code word,
  an internal own memory area MEM-Ib used to store the intermediate variables α and β of the BCJR algorithm of the second internal decoder DCI-b that processes the second code word, an exchange memory area MEM-Xa used to store the internal and external extrinsic information items exchanged between the first internal decoder DCI-a and the instance of the external decoder DCE that processes the first code word, an exchange memory area MEM-Xb used to store the internal and external extrinsic information items exchanged between the second internal decoder DCI-b and the instance of the external decoder DCE that processes the second code word.

The two sub-embodiments of this same embodiment do indeed use the same computational resource consisting in an implementation of DCE and n of DCI.

Figure 10:
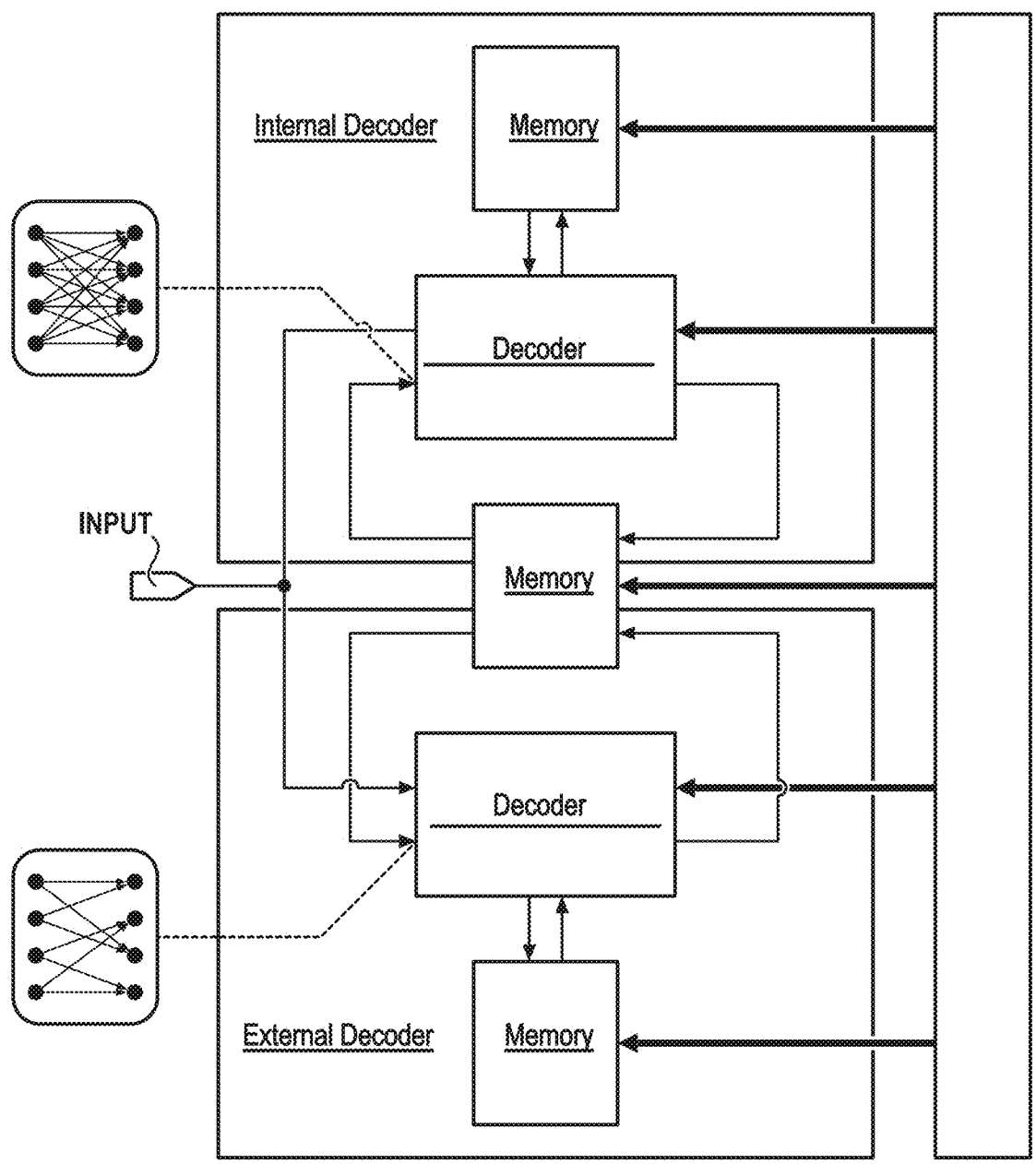
FIG. 10 shows another embodiment of the serial turbo-decoder according to the invention. Here, the decoder DCI is configured to compute the metrics of two successive state transitions of the trellis into a single time interval. The decoder DCI is of radix-4 when the decoder DCE is of radix-2. The interconnection diagram of this turbo-decoder is the same as in FIG. 6.

FIG. 10 shows an embodiment in which the internal decoder DCI is modified to use a Radix-4 BCJR algorithm. A Radix-4 BCJR algorithm processes in one go two successive branches of the trellis per time interval, i.e. it makes it possible, in this time period, to go from the section k to the section k+2 or k−2, whereas a Radix-2 BCJR algorithm processes only one branch of the trellis, going from one section to the following or preceding one, per time interval. As its name indicates, each node of this trellis has four input branches and four output branches instead of two for a Radix-2 BCJR algorithm, as shown in the bubbles of FIG. 10.

In a Radix-4 BCJR algorithm, by comparison with a Radix-2 BCJR, the number of steps is therefore divided by two as if there were twice as few sections since they are crossed by groups of two. Each branch of this trellis therefore corresponds to the processing of an assumption pertaining to two systematic data, instead of one at a time in the Radix-2 BCJR algorithm. Consequently, on the condition that the time interval is maintained, the speed of the internal decoder DCI will be doubled and the memory consumption of the node metrics in the internal decoder DCI will be divided by two. The desired aim is to accelerate the execution time of the internal decoder DCI, to make it coincide with that of the DCE. When the efficiency of the external encoder CCE is of ½, then the execution time of a radix-4 DCI will be similar to that of a radix-2 DCE.

Returning to the case in which the efficiency of the external encoder CCE is of 1/n, when the trellis of the internal decoder processing a single systematic datum at each section includes m branches, then the most elementary DCI is of radix-m, which equates to saying that the internal data DI and therefore also the data of the code word CI are of an m-ary alphabet. Thus, its execution time is n times longer than that of the most elementary DCE and the processing of n successive branches must be accumulated to bring its execution time to the level of that of the DCE. This involves exploring n times m possible branches, so the internal decoder is of radix-$m^n$. In the usual case, m has a value of two for binary data. Thus, the radix of the sought DCI does indeed have a value of 4 for an encoding CCE of efficiency ½ (n=2), as in the example of FIG. 10.

Several studies have proposed very effective radix-4 decoder architectures such as for example in these articles:

Y. Zhang and K. K. Parhi, "High-Throughput Radix-4 log MAP Turbo Decoder Architecture", 2006 Fortieth Asilomar Conference on Signals, Systems and Computers, Pacific Grove, C A, 2006, pp. 1711-1715, doi: 10.1109/ACSSC.2006.355053.

C. Studer, S. Fateh, C. Benkeser and Q. Huang, "Implementation Trade-Offs of Soft-Input Soft-Output MAP Decoders for Convolutional Codes," in IEEE Transactions on Circuits and Systems I: Regular Papers, vol. 59, no. 11, pp. 2774-2783, November 2012, doi: 10.1109/TCSI.2012.2190673.

Thus, in FIG. 10, the internal and external decoders now operate with the same speed of decoding execution, as shown in the timing diagram of FIG. 11. There is no longer any need to duplicate the DCI or to restart the DCE for the decoders to all be constantly in operation.

However, for a smaller efficiency CCE, so n greater than two, it is possible that the number of branches will exceed the number of states of the encoder, which results in an unrealistic implementation. Embodiment of the decoder DCI of radix-$m^n$ also assumes that one possesses a technical solution to work through these $m^n$ successive branches in one go, beyond the necessary increase in the hardware resources to achieve this. One alternative is then to mix and match a solution with an increase in radix to $m^q$ with a solution of duplication of $m^{(n-q)}$ decoders DCI in accordance with the device of FIG. 8a or 8-b, where q is a number smaller than n but for which the set-up of the increase in radix-$m^q$ remain easily achievable.

The invention claimed is:

1. An error-correcting serial turbo-decoder comprising:
an input configured to receive a word to be decoded comprising intrinsic information items pertaining to useful data, external and internal redundancy data,
at least one internal decoder configured to implement a SISO (Soft-In Soft-Out) algorithm and
an external decoder configured to implement a SISO (Soft-In Soft-Out) algorithm;
one of the internal decoders and the external decoder being configured to receive in parallel the intrinsic information items of the channel pertaining to a word to be decoded at the start of each decoding cycle;
the internal decoder being configured to carry out a part of the decoding of the word based on the intrinsic information items pertaining to the useful data, and the internal and external redundancy data,
the external decoder being configured to carry out another part of the decoding of the word based on the intrinsic information items pertaining to the useful data and the external redundancy data.

2. The serial turbo-decoder as claimed in claim 1, wherein:
the internal decoder is configured to generate internal extrinsic information items based on the external extrinsic information items in addition to the intrinsic information items which are provided to it and
the external decoder is configured to generate external extrinsic information items based on the internal extrinsic information items in addition to the intrinsic information items which are provided to it.

3. The serial turbo-decoder as claimed in claim 2, wherein:
the external decoder is configured to start a decoding and produce extrinsic information items based on the intrinsic information items without awaiting the availability of extrinsic information items of the internal decoder and
the internal decoder is configured to start a decoding and produce extrinsic information items based on the intrinsic information items without awaiting the availability of extrinsic information items of the external decoder.

4. The serial turbo-decoder as claimed in claim 1, the external decoder being configured to generate, at least twice, new external extrinsic information items when the internal decoder generates, once, the internal extrinsic information items.

5. The serial turbo-decoder as claimed in claim 1, further comprising:
   a memory area storing intermediate variables used by the external decoder,
   a memory area storing intermediate variables used by the internal decoder and
   a memory area storing the internal extrinsic information items and the external extrinsic information items.

6. The serial turbo-decoder as claimed in claim 1, the internal decoder being a first internal decoder and the input being a first input,
   the serial turbo-decoder comprising at least a second internal decoder and a second input receiving a second word to be decoded sent in parallel to the external decoder, which also comprises intrinsic information items pertaining to useful data, and external and internal redundancy data,
   the first internal decoder being configured to generate internal extrinsic information items of the first word based on the intrinsic information items of the first word and on external extrinsic information items of the first word and the second internal decoder being configured to generate internal extrinsic information items of the second word based on the intrinsic information items of the second word and on external extrinsic information items of the second word,
   the external decoder being configured to generate external extrinsic information items of the first word based on the intrinsic information items of the first word and on internal extrinsic information items of the first word and also to generate external extrinsic information items of the second word based on the intrinsic information items of the second word and on internal extrinsic information items of the second word.

7. The serial turbo-decoder as claimed in claim 6, the external decoder being configured to generate, once, the external extrinsic information items of the first word and the external extrinsic information items of the second word when the first internal decoder generates, once, the internal extrinsic information items of the first word and the second internal decoder generates, once, the internal extrinsic information items of the second word.

8. The serial turbo-decoder as claimed in claim 6, further comprising:
   a first memory area able to store intermediate variables used by the external decoder,
   a second memory area able to store intermediate variables used by the first internal decoder,
   a third memory area storing intermediate variables used by the second internal decoder,
   a fourth memory area storing the internal extrinsic information items of the first internal decoder and the external extrinsic information items to decode the first word and
   a fifth memory area storing the internal extrinsic information items of the second internal decoder and the external extrinsic information items to decode the second word.

9. The serial turbo-decoder as claimed in claim 8, the first memory area being partitioned into at least two memory sub-areas, with a first sub-area able to store the intermediate variables used by the external decoder to decode the first word, a second sub-area able to store the intermediate variables used by the external decoder to decode the second word, the external decoder being configured to follow any order of execution using at least two instances which each work for a different code word during one and the same iteration.

10. The serial turbo-decoder as claimed in claim 1, wherein the data of the internal encoder are m-ary and the efficiency of the external encoder is 1/n before puncturing, where n is an integer greater than or equal to 2, the external decoder implements an algorithm of Radix-m type and the internal decoder implements an algorithm of Radix-$m^p$, with p an integer less than or equal to n.

11. The turbo-decoder as claimed in claim 10 wherein a number of instances of the internal decoder is less than $m^{n-p}$.

12. A method for serial turbo-decoding of a word to be decoded comprising useful data, and internal and external redundancy data, the method comprising:
   a step of receiving intrinsic information items by an external decoder and an internal decoder of the word,
   a step of internal decoding of the word based on the intrinsic information items pertaining to the useful data, internal and external redundancy data and
   a step of external decoding of the word based on the intrinsic information items pertaining to the useful data and the external redundancy data,
the internal decoding step being carried out by the internal decoder using a SISO (Soft-In Soft-Out) algorithm, the external decoding step being carried out by the external decoder using a SISO (Soft-In Soft-Out) algorithm, the internal decoding step and the external decoding step beginning simultaneously.

13. A computer program product comprising program code instructions for executing the steps of the serial turbo-decoding method as claimed in claim 12, when the latter is executed by a processor.

* * * * *